(12) United States Patent
Roberts et al.

(10) Patent No.: US 8,725,449 B2
(45) Date of Patent: May 13, 2014

(54) METHODS AND SYSTEMS TO IMPLEMENT A SURROGATE HEAD MODEL AND DIRECTLY MEASURE BRAIN/SKULL RELATIVE DISPLACEMENT

(75) Inventors: Jack C. Roberts, Columbia, MD (US); Andrew C. Merkle, Gaithersburg, MD (US); Bliss G. Carkhuff, Laurel, MD (US); Ian D. Wing, Baltimore, MD (US); Craig B. Leese, Sykesville, MD (US)

(73) Assignee: The Johns Hopkins University, Baltimore, MD (US)

(*) Notice: Subject to any disclaimer, the term of this patent is extended or adjusted under 35 U.S.C. 154(b) by 348 days.

(21) Appl. No.: 13/168,490

(22) Filed: Jun. 24, 2011

(65) Prior Publication Data
US 2012/0330599 A1 Dec. 27, 2012

(51) Int. Cl.
*G01C 9/00* (2006.01)
*G01B 7/14* (2006.01)
*A61M 37/00* (2006.01)

(52) U.S. Cl.
USPC .......................... 702/150; 324/207.11; 600/12

(58) Field of Classification Search
USPC ......... 702/150, 41–43, 81, 84–85, 94–95, 98, 702/127, 138–140, 151–153, 182–183, 702/189; 324/200, 202, 204, 324/207.11–207.15, 207.22–207.25, 209, 324/219, 260; 703/1, 4, 11; 600/9, 12–14
See application file for complete search history.

(56) References Cited

U.S. PATENT DOCUMENTS

| | | | |
|---|---|---|---|
| 3,853,117 A | 12/1974 | Murr | |
| 4,161,874 A | 7/1979 | Specker et al. | |
| 4,691,556 A | 9/1987 | Mellander et al. | |
| 5,117,835 A | 6/1992 | Mick | |
| 5,539,935 A | 7/1996 | Rush, III | |
| 5,621,922 A | 4/1997 | Rush, III | |
| 5,978,972 A | 11/1999 | Stewart et al. | |
| 6,113,553 A | 9/2000 | Chubbuck | |
| 6,789,043 B1 | 9/2004 | Nelson et al. | |
| 6,826,509 B2 | 11/2004 | Crisco, III | |
| 7,204,165 B1 | 4/2007 | Plaga et al. | |

(Continued)

OTHER PUBLICATIONS

Nyein et al., In Silico Investigation of Intracranial Blast Mitigation with Relevance to Military Traumatic Brain Injury, Oct. 8, 2010, PNAS Early Edition, 6 pp.*

(Continued)

*Primary Examiner* — Toan Le
(74) *Attorney, Agent, or Firm* — Noah J. Hayward

(57) ABSTRACT

A human surrogate head model (HSHM) to measure brain/skull displacement due to a physical force, such as due to an explosive, ballistic, or automotive crash type of event. A HSHM may include a plurality of magnetic field generators positioned stationary relative to a HSHM skull, each to generate a magnetic field oriented with respect to a corresponding one of multiple directions. The HSHM may include one or more electromagnetic force (EMF)-based displacement sensors, each of which may include three inductive coils oriented orthogonally with respect to one another and co-aligned about a central point. A signal processor may be implemented to separate signals generated by each coil of each EMF-based displacement sensor into a plurality of component magnitudes, each attributable to a corresponding one of the magnetic fields. A computer-implemented model may be implemented to correlate between the component magnitudes and a corresponding position and orientation of the displacement sensor.

20 Claims, 18 Drawing Sheets

(56) References Cited

U.S. PATENT DOCUMENTS

| | | |
|---|---|---|
| 2005/0100873 A1 | 5/2005 | Meythaler et al. |
| 2005/0177335 A1 | 8/2005 | Crisco, III et al. |
| 2005/0177929 A1 | 8/2005 | Greenwald et al. |
| 2006/0038694 A1 | 2/2006 | Naunheim et al. |
| 2009/0216149 A1 | 8/2009 | Neff et al. |

OTHER PUBLICATIONS

Caruso et al., Development of Synthetic Cortical Bone for Ballistic and Blast Testing, 2006, Journal of Advanced Materials, vol. 38, No. 3, pp. 27-36.*

Roberts, J.C. et al., "Assessing Blast Induced Neurotrauma (BINT) Using Head/Neck Experimental and Computational Models," Blast Injury Symposium, Wayne State University, pp. 1-22, May 15-16, 2008, Detroit, MI.

Merkle, A.C. et al., "Development of a Human Head Physical Surrogate Model for Investigating Blast Injury," 2009 ASME International Mechanical Engineering Congress & Exposition, pp. 1-4, and Power Point pp. 1-18, Nov. 13-19, 2009, Lake Buena Vista, FL.

Merkle, A.C. et al., "Human Surrogate Head Response to Dynamic Overpressure Loading in Protected and Unprotected Conditions," The 26th Southern Biomedical Engineering Conference, May 1, 2010, pp. 1-3, and Power Point pp. 1-22, College Park, MD.

* cited by examiner

1800 ⟶

| Sensor Type | Sensor Name | S/N | Manufacturer | Sensitivity @ 5V exc |
|---|---|---|---|---|
| Inertial Sensor Component | 6DX-ACC1 | 6DX0008 | DTS | 0.2070 mV/g |
| Inertial Sensor Component | 6DX-ACC2 | 6DX0008 | DTS | -0.2170 mV/g |
| Inertial Sensor Component | 6DX-ACC3 | 6DX0008 | DTS | 0.2510 mV/g |
| Inertial Sensor Component | 6DX-ARS1 | 6DX0008 | DTS | 0.2216 mV/dps* |
| Inertial Sensor Component | 6DX-ARS2 | 6DX0008 | DTS | 0.2174 mV/dps* |
| Inertial Sensor Component | 6DX-ARS3 | 6DX0008 | DTS | 0.2461 mV/dps* |
| Surface Pressure Sensor | FACE-FOREHEAD | 1290621 | Honeywell | 1.0920 mV/psi |
| Surface Pressure Sensor | FACE-CHEEK | 1290414 | Honeywell | 0.9757 mV/psi |
| Surface Pressure Sensor | REAR | 1290413 | Honeywell | 1.11679 mV/psi |
| Surface Pressure Sensor | FACE-CHIN | 1290412 | Honeywell | 1.0450 mV/psi |
| Surface Pressure Sensor | SIDE-RIGHT | 1290411 | Honeywell | 0.92478 mV/psi |
| Intracranial Pressure Sensor | ICP_ANT | X0909N | Measurement Spec. | 0.2982 mV/psi |
| Intracranial Pressure Sensor | ICP_POS-1 | X0909J | Measurement Spec. | 0.2982 mV/psi |
| Intracranial Pressure Sensor | ICP_POS-2 | X0909Q | Measurement Spec. | 0.2982 mV/psi |

*set to 10V exc, but internally regulated

FIG. 18

METHODS AND SYSTEMS TO IMPLEMENT A SURROGATE HEAD MODEL AND DIRECTLY MEASURE BRAIN/SKULL RELATIVE DISPLACEMENT

STATEMENT OF GOVERNMENTAL INTEREST

This invention was made with U.S. Government support under Office of Naval Research contract number N00024-98-D-6606. The U.S. Government has certain rights in the invention.

BACKGROUND

1. Technical Field

Disclosed herein are methods and systems to implement a physical model, including housing and a gelatinous material therein, and to measure displacements of the gelatinous material in response to a physical force experienced by the model. The model may be used as a surrogate head model to measure brain/skull displacement due to a physical force, such as due to an explosive, ballistic, or automotive crash type of event.

2. Related Art

The U.S. Centers for Disease Control (CDC) defines a traumatic brain injury as a blow, jolt or penetrating impact to the head that disrupts normal brain function. According to a 2006 CDC study, over 1.4 million people sustain a TBI in the U.S. each year. Of those, 235,000 are hospitalized, and 50,000 die.

While leading causes of TBI are falls and motor vehicle accidents, military-related blast injuries are an increasingly important etiology for TBI. According to a 2008 RAND study, approximately 320,000 U.S. individuals involved in U.S. military deployments over the past decade experienced a probable TBI.

Improved interceptive properties of helmets have contributed to increased soldier survivability through the prevention of penetrating injuries. However, the number of casualties exhibiting signs of non-penetrating head injury due to blast exposure has also increased.

Physical models of the human head have been developed to gain insight into blast exposure.

Nahum, et al. (1968), and Trosseille, et al. (1992), performed experiments with post mortem human subjects (PMHS), by attaching pressure transducers and neutral density accelerometers to the skull to measure acceleration of the head and pressures in the brain.

General Motors Corporation developed a device, referred to a Hybrid III anthropomorphic test device (AID), around 1973, to evaluate automotive occupant safety. The device includes a headform having a cast aluminum skull and vinyl rubber exterior skin. The exterior anthropometry of the Hybrid III headform is reasonably accurate from a basic plane upward. Mass characteristics of the headform are similar to those of a human, with replication of rigid body head kinematics. The headform may include instrumentation to measure of linear and angular accelerations in three orthogonal directions. Physical properties of the aluminum skull are not, however, representative of those of a human skull. In addition, the headform does not include a brain stimulant material. Transmission and reflection of a blast wave is thus likely to be dissimilar to that of a human head.

Margulies, (1987), Thibault, et al. (1987), and Thibault, et al. (1990), studied a test fixture having cranial sections filled with silicone gel, and an orthogonal grid placed between layers of the gel. In the studies, the test fixture was subjected to an acceleration pulse. High speed photography was used to capture deformation of the grid, from which displacements and strains could be computed. This technique was also used by Meaney, et al. (1995), in a study to correlate in-vitro tissue modeling with histologic and radiologic evidence of axonal injury to predict regions of injury from experimental and analytical analysis, and (Meaney, et al., 1995).

Hardy, et al. (1996), and Hardy, et al. (1997), used neutral density targets (NDTs), placed within PMHS brains, and a speed bi-planar x-ray system to measure local brain displacement, from which strains could be computed.

Hardy, et al. (2001), used an array of NDTs arranged in two columns in a severed head. The first column contained five or six NDTs and was located in the occipitoparietal region and the temporoparietal region of the brain. A suspension test fixture was used for testing the inverted perfused, human cadaver heads and the test fixture.

Ivarsson, et al. (2006), Bradshaw, et al. (2001), and Ivarsson, et al. (2002), used a technique similar to that of Margulies (1997), by designing a parasaggital model of a human skull made of aluminum and filled with a silicone gel. Within the gel were white markers in a grid-form that, when used with high speed photography, would allow determination of displacements and strains.

Makris, et al. (September, 2000), and Chichester, et al. (May, 2001), used anthropomorphic test devices (ATDs), outfitted with pressure transducers on a head skin surface and accelerometers in the head, as well as pressure transducers and accelerometers on other body parts, to study the effects of blast. The ATDs were in a kneeling position while exposed to different charge sizes.

Bayley, et al. (2004), Bayley, et al. (2005), and Bayley, et al. (2006), used harmonic phase (HARP) analysis of tagged magnetic resonance images (MRI) to determine strains in a gel model, human volunteers, and animal models.

Defense Research and Development Canada, Vulcartier (DRDC Valcartier), developed a device referred to as a Manikin for Assessing Blast Incapacitation and Lethality (MABIL), to evaluate personal protection concepts developed for the protection against blast threats. The device includes a headform formed of solid urethane based on anthropometric data, and includes a pressure sensors in an ear, a pressure sensor in the mouth, and a photodiode in an eye to measure light intensity. The MABIL headform does not include a brain stimulant material and thus does not support measurement of brain-skull displacement.

The United Kingdom, Defence Evaluation and Research Agency (DERA), developed a device known as a Dynamic Event Response Analysis Man (DERAMan). The device includes a head, with a skull and soft gel brain stimulant, mounted to a compliant neck. 40 piezoelectric polymer pressure sensors located within the brain section, 45 piezoelectric ceramic pressure sensors mounted to an inside surface of the skull, two accelerometers, and a three-dimensional force gauge.

Synthetic cortical bone is addressed in Caruso, et al., *Development of Synthetic Cortical Bone for Ballistic and Blast Testing*, Journal of Advanced Materials, 38 (3), pages 27-36, 2006.

SUMMARY

Disclosed herein are methods and systems to implement a physical model, including a housing and a gelatinous material therein, and to measure displacements of the gelatinous material in response to a physical force experienced by the model.

The physical model may be used as a surrogate head model to measure brain/skull displacement due to a physical force, such as due to an explosive, ballistic, or automotive crash type of event. The surrogate head model may be implemented as a human surrogate head model (HSHM). For illustrative purposes, methods and systems disclosed herein may be described with reference to a HSHM. Methods and systems disclosed herein are not, however, limited to a surrogate head model.

A HSHM may include one or more biosimulant materials to represent skin, face, skull, and/or brain tissue.

A HSHM may be mounted to a neck device, such as a Hybrid III Anthropomorphic test device, to permit head motion during loading.

A HSHM may include one or more displacement sensors and/or pressure sensors embedded within a gelatinous brain stimulant, which may populate the brain stimulant in one or more of a variety of fashions. Displacement sensors may be positioned, for example, within anterior and posterior areas of the brain along a saggital plane.

A HSHM may include one or more displacement sensors, each in a stationary position relative to the HSHM housing and oriented with respect to a corresponding one of multiple directions.

A HSHM may include a plurality of magnetic field generators positioned stationary relative to a cranium portion of the HSHM, and may further include one or more electromagnetic force (EMF)-based displacement sensors, each including a plurality of inductive coils oriented with respect to a corresponding one of multiple directions, each coil to generate an electric signal in response to the magnetic fields of the plurality of generators. An EMF-based displacement sensor may include 3 coils, oriented orthogonally with respect to one another and co-aligned about a central point, referred to herein interchangeably as a co-aligned triad displacement sensor, and a 6-degree-of-freedom (6-DOF) displacement sensor.

A signal processor may be implemented to separate signals generated by each coil of each EMF-based displacement sensor into a plurality of component magnitudes, each attributable to a corresponding one of the magnetic fields.

A computer-implemented model may be implemented to correlate between the component magnitudes and a corresponding position and orientation of the displacement sensor.

BRIEF DESCRIPTION OF THE DRAWINGS/FIGURES

FIG. 18 is a table of features of pressure sensors and components of an inertial sensor of the HSHM of FIG. 17.

Figure 1:
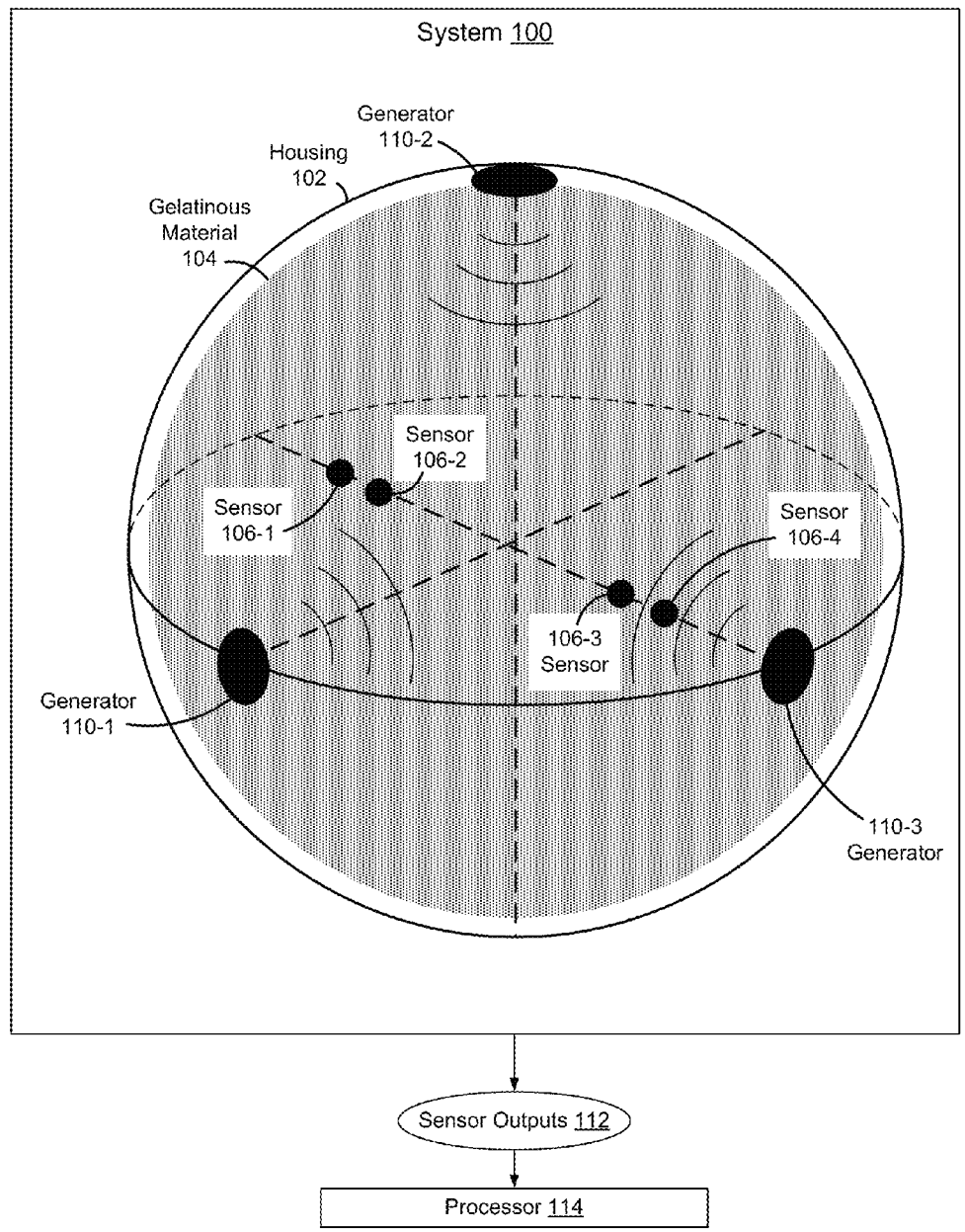
FIG. 1 is an elevated perspective view of a system including a housing having a gelatinous material disposed therein, and one or more displacement sensors disposed or suspended within gelatinous material.

In the drawings, the leftmost digit(s) of a reference number identifies the drawing in which the reference number first appears.

DETAILED DESCRIPTION

FIG. 1 is an elevated perspective view of a system 100, including a housing 102 having a gelatinous material 104 disposed therein, and one or more displacement sensors 106 disposed or suspended within gelatinous material 104. The one or more sensors 106 may be referred to herein in the plural for illustrative purposes.

Housing 102 may be fabricated from one or more materials suitable to hold gelatinous material 104.

In FIG. 1, housing 102 is illustrated with a spherical shape. Housing 102 is not, however, limited to spherical shapes.

Gelatinous material 104 may have a relatively high viscosity, or a relatively low hardness, firmness, durometer. Gelatinous material 104 may have properties such that sensors 106 are neutrally buoyant therein, and remain in relatively fixed positions relative to gelatinous material 104. Gelatinous material 104 may include, for example, a polymer, such as rubber or silicone, which may include a vulcanized rubber or silicone such as room-temperature vulcanized (RTV) silicone. Gelatinous material 104 may include a poly-dimethyl siloxane (PDMS) gel developed by Dow Corning Corporation, of Midland, Mich., and marketed under the name, Sylgard®, such as Sylgard® 527, having an advertised viscosity of 450 milli Pascal-second (mPa·s) at 23 C.

In FIG. 1, system 100 is illustrated with multiple sensors, 106-1, 106-2, 106-3, and 106-4, aligned substantially linearly with one another, with sensors 106-1 and 106-2 positioned relatively close to one another, and sensors 106-3 and 106-4 positioned relatively close to one another. Sensors 106 are not, however, limited to the example arrangement of FIG. 1.

System 100 may include a plurality of generators 110, to generate, radiate, and/or project energy within gelatinous material 102. The energy may be in a form of a magnetic field, an electric field, an electromagnetic field, and/or propagating light. Each generator 110, or a portion thereof, is positioned stationary relative to housing 102, and may be attached to housing 102.

In the example of FIG. 1, system 100 includes three generators, 110-1, 110-2, and 110-3, each of which may be oriented to project energy relative to a corresponding one of multiple directions. The multiple directions may be substantially orthogonal to one another. Methods and systems disclosed herein are not, however, limited to three generators or orthogonal orientation.

Displacement sensors 106 may each be implemented to receive, sense, and/or detect energy, from multiple generators 110, and to provide a corresponding sensor output 112 indicative of a strength or intensity of energy detected from the multiple generators 100. Sensor outputs 112 may include electrical signals having magnitudes indicative of a strength or intensity of detected energy. The magnitude of an electrical signal may depend upon a position and orientation of a corresponding displacement sensor 106, relative to each generator 110.

Sensor outputs 112 may be provided to one or more processors, illustrated here as a processor 114. Processor 114 may include an analog and/or digital signal processor, and/or an instruction processor, also referred to herein as a computer system. Processor 114, or portions thereof, may be implemented in a centralized fashion, a distributed fashion, and combinations thereof.

Processor 114 may be implemented to determine positions and/or angular orientations of sensors 106 from the corresponding sensor outputs 112. Processor 114 may be implemented to determine position and/or orientation in terms of displacement relative to a rest state at which housing 102 and gelatinous material 104 are relatively undisturbed with respect to one another.

When housing 102 is subjected to a physical force, gelatinous material 104, or portions thereof, may move relative to housing 102. Correspondingly, sensors 106 may move relative to the energies projected by generators 110. As a result, magnitudes sensor outputs 112 may change from steady state values.

Displacement sensors 106 may be implemented to respond to relatively high-rate or frequency changes in displacement with relatively high precision. Displacement sensors 106 may be implemented for example, with a positional precision of less than approximately 0.5 millimeters (mm), an angular orientation precision of less than approximately 1 degree, and with a response time of less than approximately 50 microseconds.

Processor 114 may be implemented to determine linear and/or angular displacements with respect to multiple axes.

Processor 114 may be implemented to determine a measure of strain between multiple displacement sensors 106.

System 100 may include one or more pressure sensors to measure intracranial pressure.

System 100 may include one or more accelerometers to measure acceleration and/or de-acceleration of gelatinous material 104 relative to housing 102, and or to determine displacement such as with a double integration of acceleration.

Surrogate Head Model

System 100 may be implemented as a surrogate head model, in which housing 102 is implemented to simulate a skull, such as a human skull, or a portion thereof, such as a cranium, and gelatinous material 104 is implemented to simulate brain matter or tissue within the skull.

A head model may be used to examine and/or measure a response of the brain matter simulant to a physical force directed at housing 102, such as to determine displacement, pressure change, strain and/or acceleration of the brain matter simulant relative to housing 102.

Figure 2:
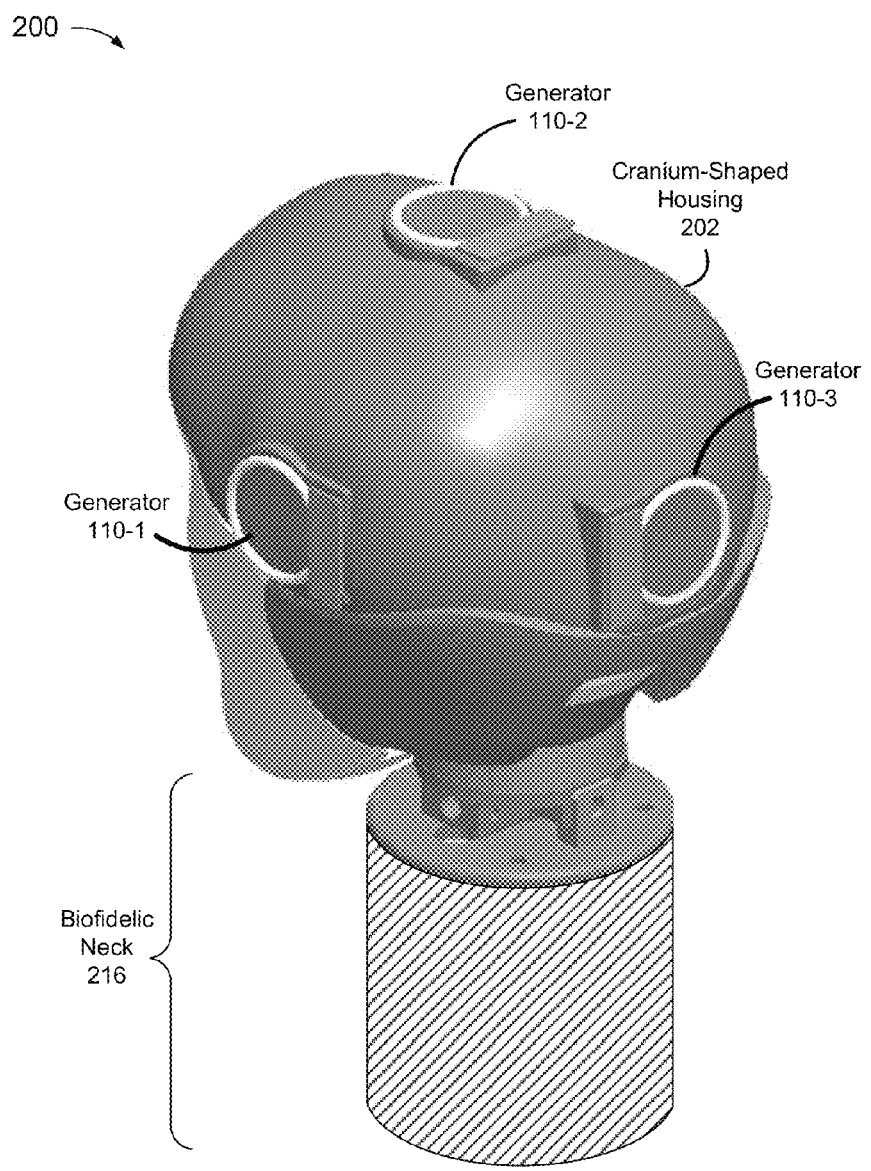
FIG. 2 is an elevated perspective view of a head model, including a cranium-shaped housing and generators attached thereto.

FIG. 2 is an elevated perspective view of a head model 200, including a cranium-shaped housing 202, and generators 110 attached thereto.

Cranium-shaped housing 202 may be fabricated from one or more materials to provide mechanical properties that are similar to human skull or cranium bone, such as human compact or cortical bone tissue. Cranium-shaped housing 202 may be fabricated from, for example, a mixture of glass and thermosetting polymer, also referred to herein as epoxy, to provide a bending stiffness, a bending strength, and/or a fracture toughness similar to that of human compact bone. Cranium-shaped housing 202 may be fabricated to withstand multiple shock tube and/or live fire open-field blast tests with substantially little or no adverse impact on cranium-shaped housing 202 and/or materials and/or sensors therein.

Cranium-shaped housing 202 may have one or more of the following physical properties:
  a bending modulus within a range of approximately 1.2 to 15 giga Pascal (GPa);
  a bending strength within a range of approximately 60 to 200 mega Pascal (MPa); and
  a fracture toughness within a range of approximately 1.6 to 12 mega Pascal per square root meter (MPa √m).

Cranium-shaped housing 202 may include facial features.

Head model 200 may include a skin simulant disposed over at least a portion of a surface of cranium-shaped housing 202. The skin simulant may include a silicone sheathe stretched over cranium-shaped housing 202. The skin simulant may be molded to fit a facial structure of cranium-shaped housing 202.

Head model 200 may include a brain stem and/or neck structure, illustrated here as a biofidelic neck 216, which may correspond to a neck device of a Hybrid III Anthropomorphic test device.

In the example of FIG. 2, generators 110 are illustrated as attached to cranium-shaped housing 202.

Figure 3:
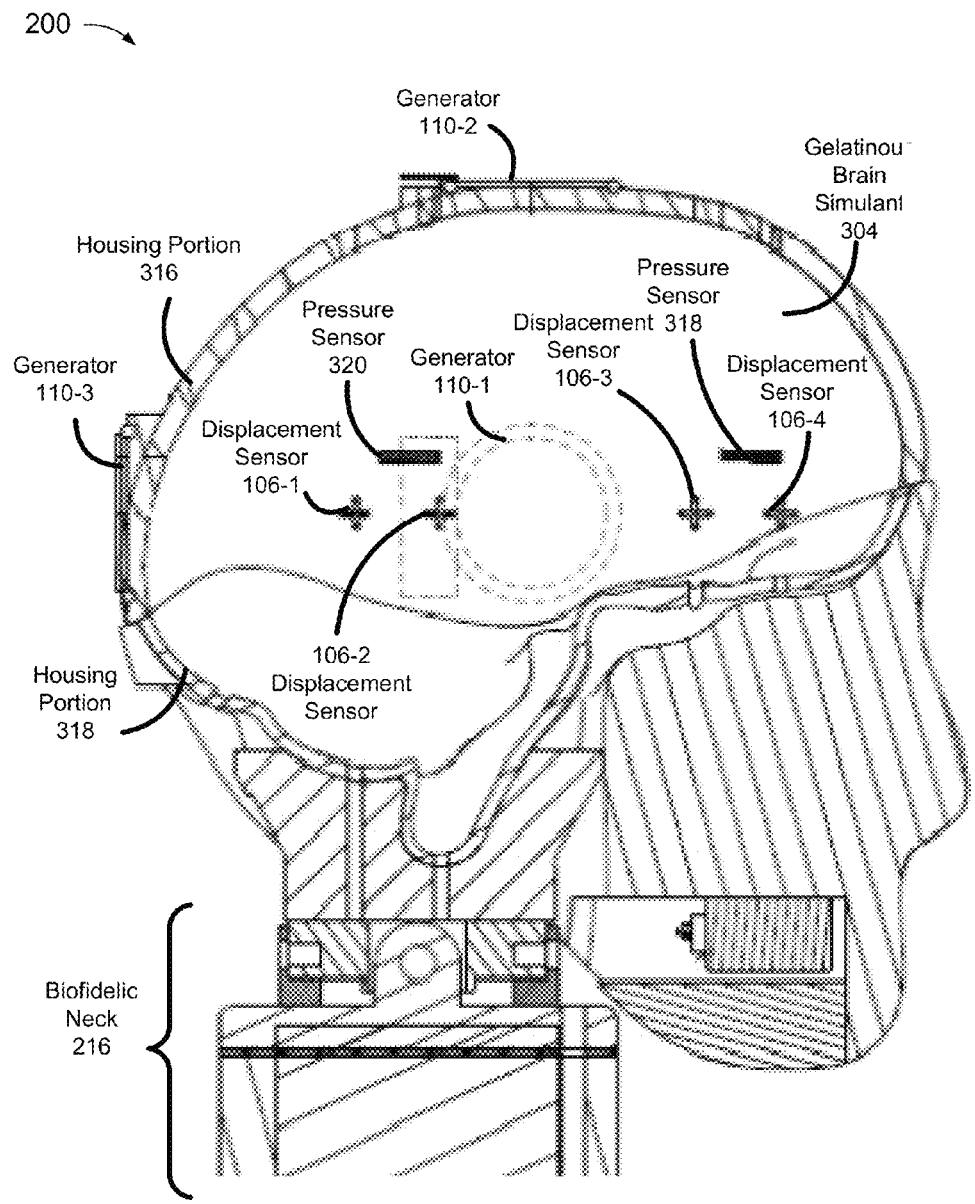
FIG. 3 is a cross-sectional side-view of the head model of FIG. 2, including displacement sensors and pressure sensors within a gelatinous brain stimulant, and facial features.

FIG. 3 is a cross-sectional side-view of head model 200, including sensors 106 and pressure sensors 318 and 320 positioned within a gelatinous brain stimulant 304.

Gelatinous brain stimulant 304 may have one or more physical properties that are similar to one or more corresponding physical properties of brain tissue. For example, gelatinous material 104 may have a resistance to indentation similar to that of brain tissue. Resistance to indentation may be defined in terms of viscosity, durometer, and/or hardness.

In the example of FIG. 3, sensors 106-1 and 106-2 are positioned within a posterior or occipital region of housing 202, and sensors 106-3 and 106-4 are positioned within an anterior or frontal lobe region of housing 202. In addition, sensors 106-1 and 106-2 are positioned physically proximate to one another, and sensors 106-3 and 106-4 are positioned physically proximate to one another. Such an arrangement may permit processor 114 to determine a strain between displacement of sensors 106-1 and 106-2, and between sensors 106-3 and 106-4.

Displacement sensors 106 may each have a diameter within a range of, for example, approximately 3-5 millimeters (mm), and displacement sensors 106-1 and 106-2, and/or sensors 106-3 and 106-4 may be positioned, for example, approximately 5 mm from one another. Sensors 106-1 and 106-2 may be positioned, for example, approximately 18 mm from sensors 106-3 and 106-4.

In the example of FIG. 3, sensors 106 are illustrated as substantially longitudinally aligned along a sagittal plane.

Methods and systems disclosed herein are not limited to the example arrangement of FIG. 3.

Head model 200 may include one or more additional sensors, which may include one or more additional displacement sensors 106, one or more pressure sensors, and/or one or more accelerometers. In the examples of FIGS. 3A and 3B, head model 200 includes pressure sensors 320 and 322 disposed within gelatinous brain simulant 304, each proximate to a corresponding set of displacement sensors 106.

Figure 4A:
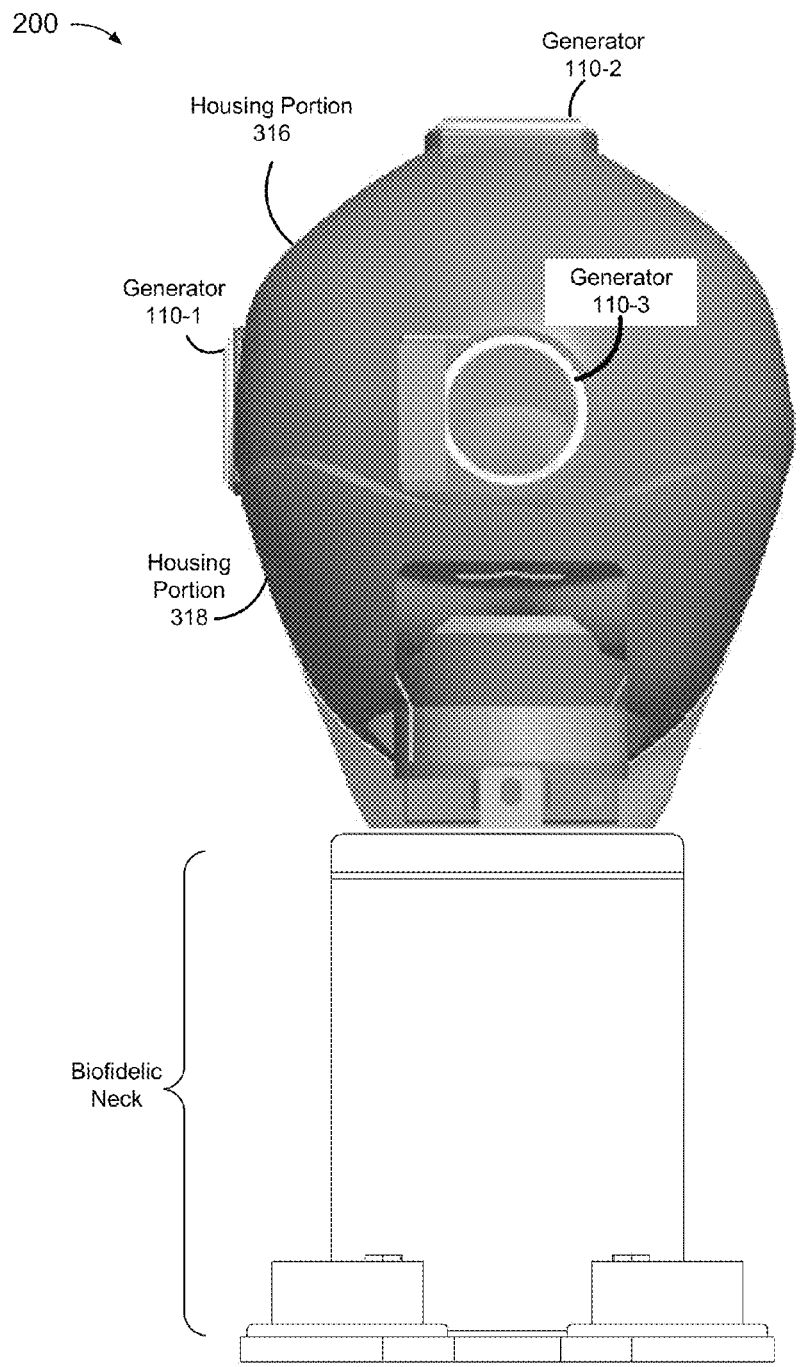
FIG. 4A is a perspective, partial cut-away view of the head model of FIG. 2, directed toward a posterior or occipital lobe portion.

FIG. 4A is a perspective, partial cut-away view of head model 200, directed toward a posterior or occipital lobe portion.

Figure 4B:
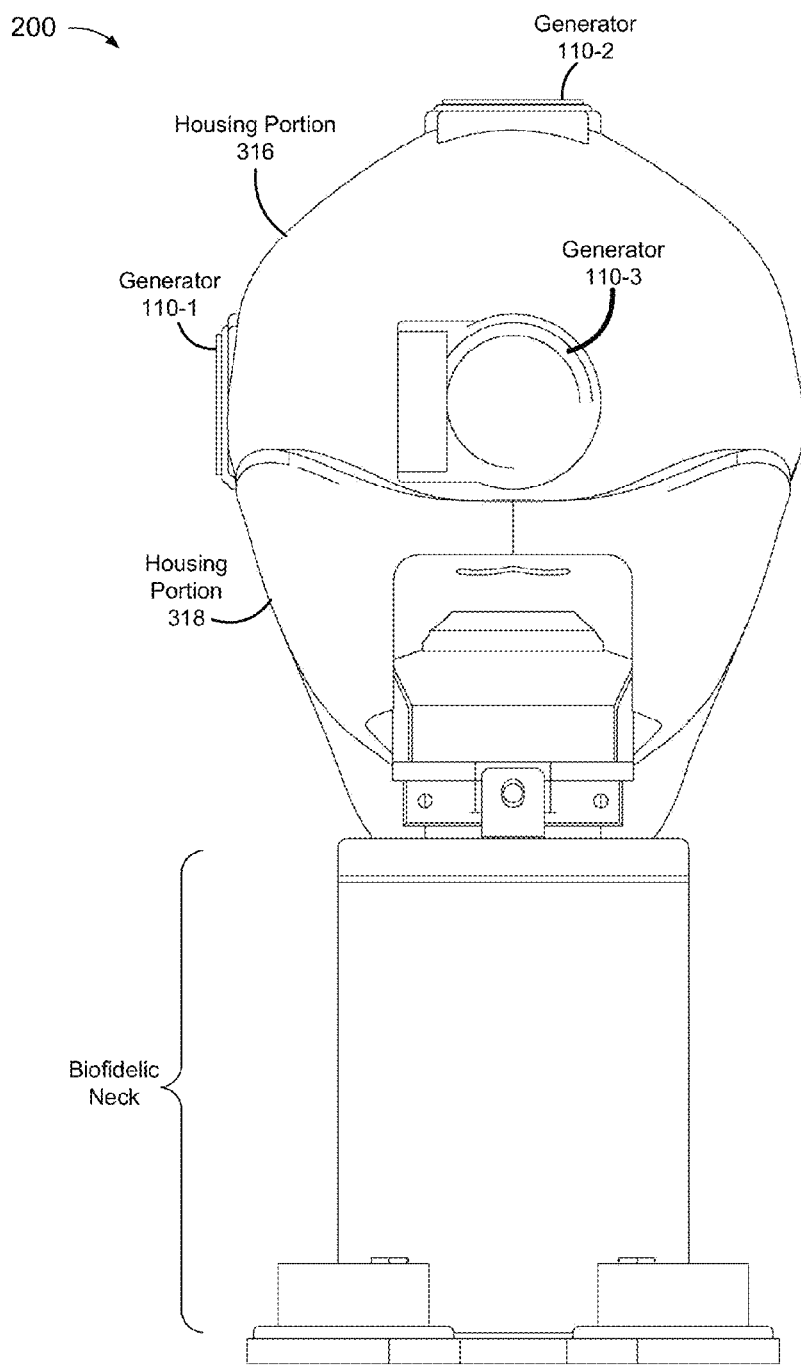
FIG. 4B is another perspective, partial cut-away view of the head model of FIG. 2, directed toward the posterior or occipital lobe portion.

FIG. 4B is another perspective, partial cut-away view of head model 200, directed toward the posterior or occipital lobe portion.

Cranium-shaped housing 202, gelatinous brain simulant 304, and/or portions thereof, may be fabricated in sections or components. In FIGS. 3, 4A, and 4B, for example, cranium-shaped housing 202 includes first and second housing portions 316 and 318, respectively, which may be separable from one another, such as to permit access to gelatinous brain simulant 304 and/or sensors therein.

Head model 200, or portions thereof, may be fabricated with one or more components and/or materials described below with reference to one or more of FIGS. 17 and 18, and may be fabricated with a molding process.

Position, Orientation, and Displacement Determination

Faraday's Law of Induction ("Faraday's Law"), describes relationships between electric currents, conductive coils, and induced electromagnetic fields. Faraday's Law states that a current, or electromotive force (EMF), is induced in a conducting loop when it the conducting loop moves through a static magnetic field. Conversely, a current may be produced in a static loop by varying the strength of the magnetic field. Furthermore, a current flowing through a loop of wire produces a magnetic field.

Mathematically, EMF is equal to a line integral of an electric field around a loop, which is equivalent to a negative rate of change of the magnetic flux through the loop:

$$\text{emf} = \oint \vec{E} \cdot \vec{ds} = -\frac{d\Phi_B}{dt} \qquad \text{EQ. (1)}$$

Electrical transformers are based on EMFs predicted by Faraday's law. With an electrical transformer, when an electric current in a first loop of wire changes, a changing magnetic field is induced in a vicinity of the first loop. A second wire loop within the changing magnetic field will experience a change in a coupled magnetic flux, which gives rise to an EMF in the second loop. If two points of the second loop are connected through a resistive/capacitive load, the EFM will induce a current to flow through the load, which may create a voltage.

Magnitudes of the induced current and corresponding voltage will vary with changes in the current applied to the first loop. Thus, an alternating current in the first loop induces an alternating current in the second loop, and corresponding alternating voltage, having a frequency of the alternating current of the first loop.

Magnitude of the induced current and the corresponding voltage may be a function of a combination of the magnitude of the current in the first loop, a distance between the first and second loops, orientations of the first and second loops relative to one another, and surface areas of the first and second loops. The surface area of each loop may each be a function of a corresponding number of turns or wire windings and a loop diameter, and diameters of the wires.

In FIG. 1, each generator 110 may include a wire loop, or coil, oriented with respect to a corresponding one of multiple directions or dimensions, to generate a magnetic field oriented with respect to the corresponding direction or dimension. Where three generators, 110-1, 110-2, and 110-3 are implemented, as illustrated in FIG. 1, the generators 110-1, 110-2, and 110-3 may be oriented substantially orthogonal with respect to one another. Orientations of generators 110-1, 110-2, and 110-3 may be referred to herein as x, y, and z-axis orientations, respectively.

Displacement sensors 106 may each include multiple wire loops, or coils, each oriented with respect to a corresponding one of multiple directions or dimensions. Each displacement sensor 106 may include, for example, three coils arranged substantially orthogonally with respect to one another, referred to herein as a triad. Such an arrangement may help to insure that each sensor 106 senses or detects the magnetic fields produced by each of generators 110-1, 110-2, and 110-3.

The multiple coils of a sensor 106 may be centered about a common point, referred to herein as co-aligned.

Figure 5:
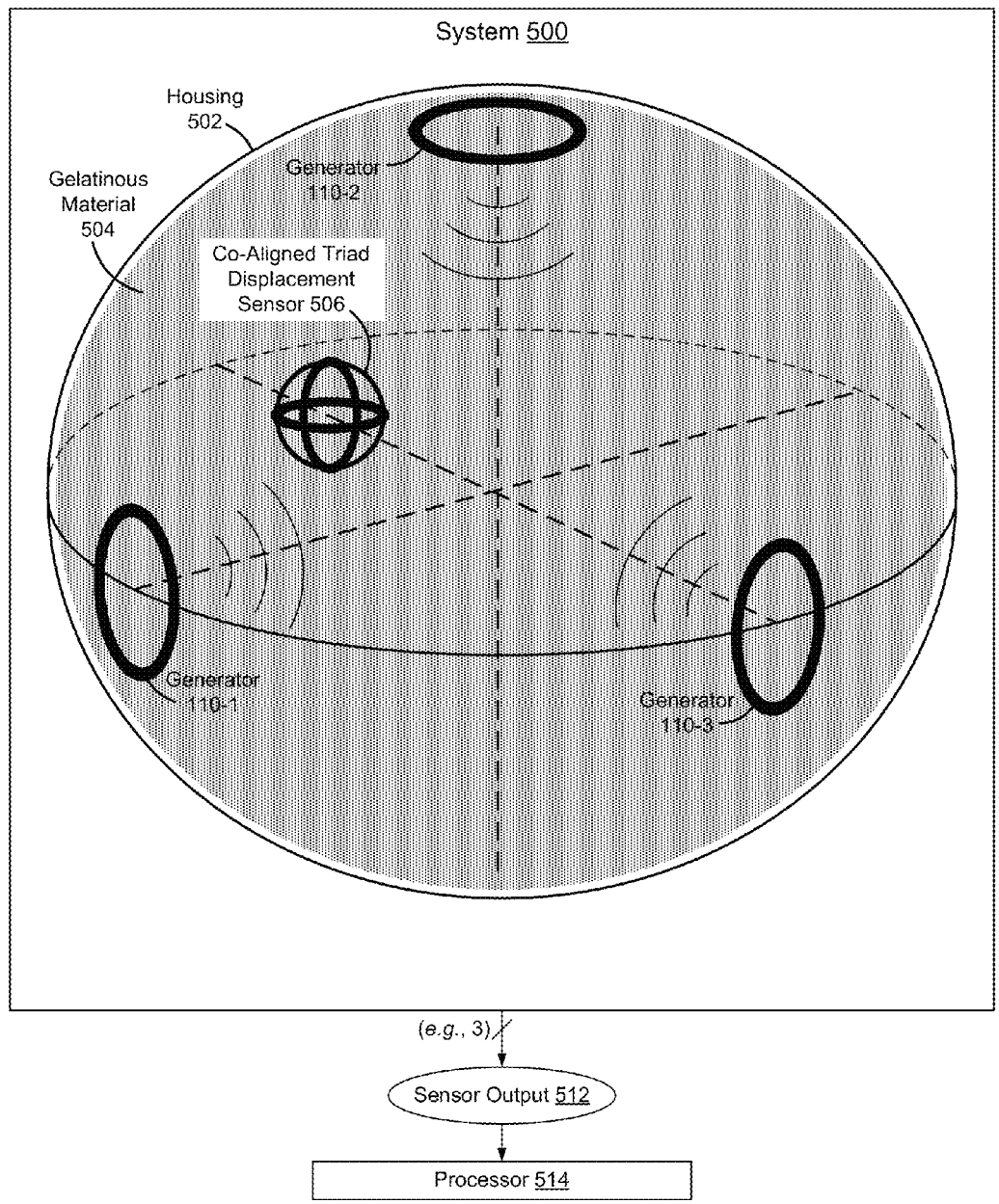
FIG. 5 is a perspective view of a system including a plurality of magnetic field generators, and a displacement sensor having three coils oriented substantially orthogonally with respect to one another and centered about a common point, referred to herein as a co-aligned triad.

FIG. 5 is a perspective view of a system 500, including generators 510-1, 510-2, and 510-3, each including a wire coil, and further including a displacement sensor 506.

Figure 6:
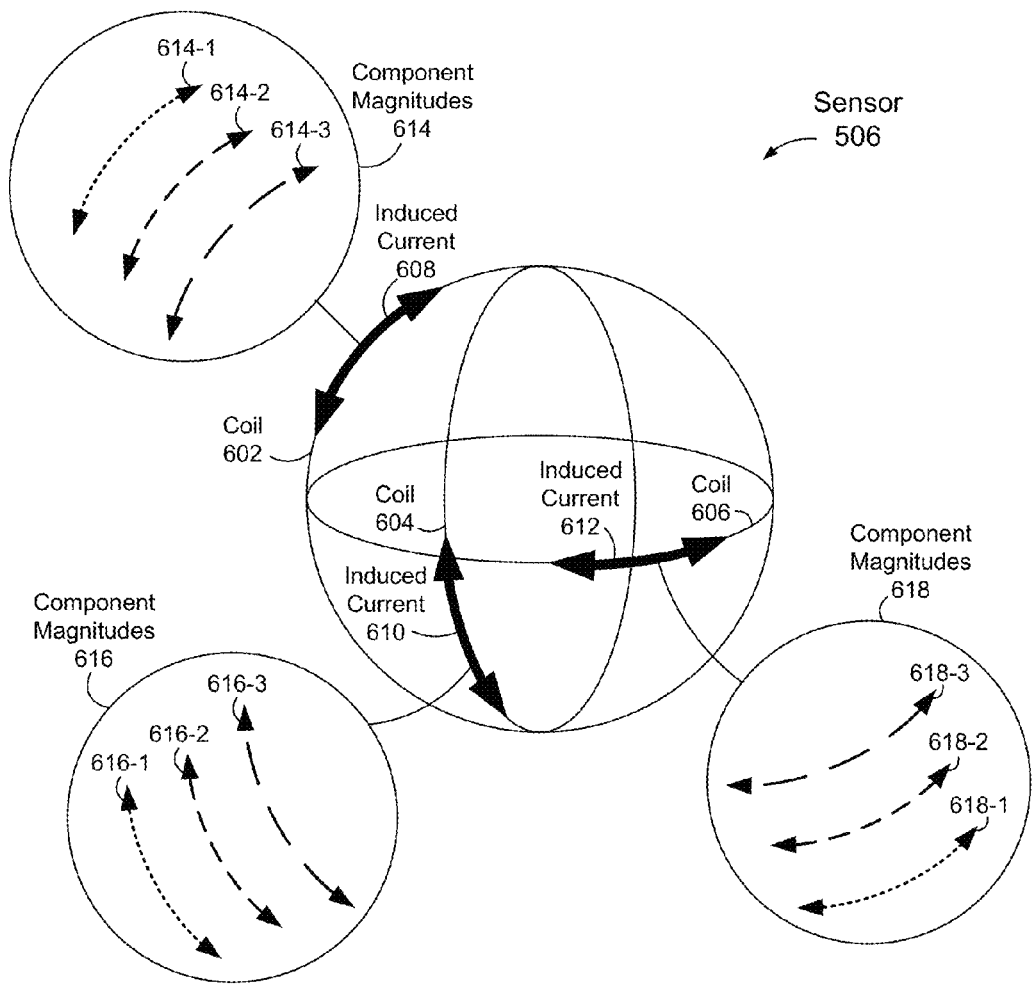
FIG. 6 is a perspective view of the displacement sensor of FIG. 5 to illustrate induced currents and corresponding component magnitude attributable to corresponding ones of the magnetic field generators.
Figure 6:
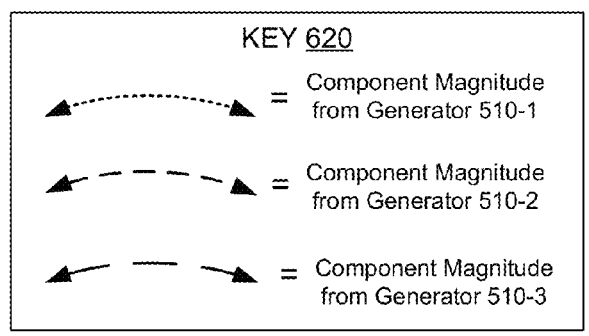

FIG. 6 is a perspective view of displacement sensor 506, including coils 602, 604, and 606, oriented substantially orthogonally with respect to one another and centered about a common point, referred to herein as a co-aligned triad.

System 500 may represent an example implementation of system 100 in FIG. 1, and may be implemented as a surrogate head model such as described with reference to FIGS. 2 through 4.

Coils of generators 510 and displacement sensor 506 may be fabricated with materials and/or dimensions to obtain a desired level of precision in displacement measurements. Example implementations are provided below.

Coils 602, 604, and 606 of sensor 506 may each have a greater number of turns or windings than coils of generators 510. Coils 602, 604, and 606 of sensor 506 may have, for example, approximately 50 turns, and the coils of generators 510 may have, for example, approximately five turns.

Coils of generators 510 may have may have a diameter that is greater than a diameter of coils 602, 604, and 606 of sensor 506. Coils 602, 604, and 606 may have a diameter within a range of, for example, approximately 3 to 5 mm.

Coils 602, 604, and 606 may each include a wire loop of approximately 50 turns. The wire may substantially conform to an American Wire Gauge (AWG) standard 38, or 38 AWG wire.

Coil 602, 604, and 606 may be fabricated by wrapping the wire approximately fifty times around a wax mandrel. The wax mandrel may initially have a substantially cubic shape with three channels, one per plane, scored in surfaces thereof to form a sphere having a diameter within a range of approximately 3 to 5 mm. Glue, such as a cyanoacrylate glue, may be applied to the wire-wound wax mandrel to secure the windings and coils, and the wax mandrel may be melted away, such as with boiling water.

Generators 510 may be fabricated by wrapping 22 AWG wire, for example, five times around a wax mandrill to create a coil. Glue may be applied to secure the windings, and the wax mandrel may be melted away.

Wire leads of the coil may be connected to a circuit to create an inductive-capacitive (LC) circuit. A resonant frequency of the LC circuit may be determined by an inductance of the coil and a tuning capacitance of the circuit. Generators 510-1, 510-2, and 510-3 may each be implemented to resonate at a corresponding one of multiple frequencies, which may permit processor 514 to separate magnitude components of signals induced in coils of displacement sensor 506.

System 500 may include one or more additional displacement sensors 506, which may be positioned as described in one or more examples herein.

A magnetic sensor system for three-dimensional position measurements is taught in U.S. Pat. No. 6,789,043, to Nelson et al., which is incorporated herein by reference in its entirety.

FIG. 6 is a perspective view of displacement sensor 506 to illustrate induced currents and corresponding magnitude components attributable to corresponding ones of generators 510-1, 510-2, and 510-3.

In FIG. 6, coils 602, 604, and 606 are illustrated with respective currents 608, 610, and 612, each induced in response to a combination of the magnetic fields of generators 510-1, 510-2, and 510-3. Induced currents 608, 610, and 612 may each include a convoluted sinusoid with components attributable to each of the magnetic fields.

Induced current 608 may include component magnitudes 614-1, 614-2, and 614-3, each attributable to a corresponding one of generators 510-1, 510-2, and 510-3.

Induced current 610 may include component magnitudes 616-1, 616-2, and 616-3, each attributable to a corresponding one of generators 510-1, 510-2, and 510-3.

Induced current 612 may include component magnitudes 618-1, 618-2, and 618-3, each attributable to a corresponding one of generators 510-1, 510-2, and 510-3.

A three-dimensional position of sensor 506 may be determined solely from magnitudes of induced currents 608, 610, and 612, or from component magnitudes of currents of 608, 610, and 612.

An orientation of sensor 506 may be determined from component magnitudes of currents of 608, 610, and 612.

Processor 514 may be implemented to determine both a 3-dimensional position and orientation of sensor 506 from component magnitudes of currents of 608, 610, and 612.

Processor 514 may be implemented to determine a displacement of sensor 506 in terms of a change in position and/or orientation of sensor 506 relative to a steady state or rest position and orientation of gelatinous material 504 and displacement sensor 506.

Position, orientation, and/or displacement may be determined with one or more of a variety of techniques.

Figure 7:
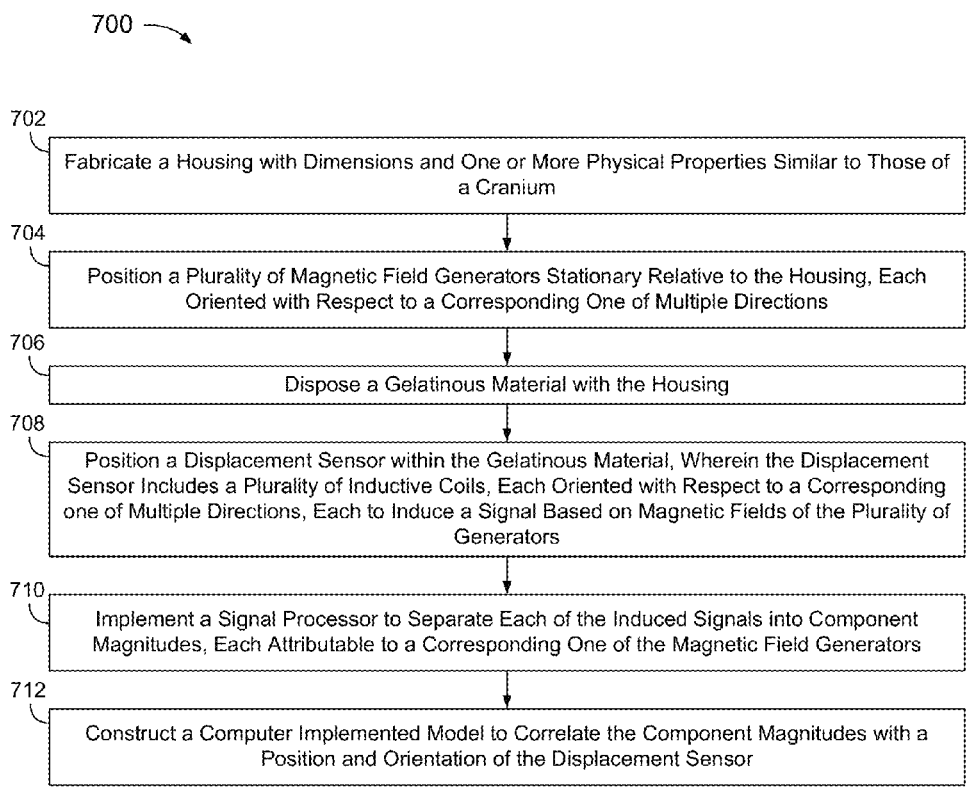
FIG. 7 is a flowchart of a method 700 of implementing a surrogate model to measure position, orientation, and/or displacement

FIG. 7 is a flowchart of a method 700 of implementing a surrogate model to measure position, orientation, and/or displacement. The surrogate model may be implemented as a surrogate head model to measure brain/skull displacement, such as due to an explosive or ballistic type of event.

At 702, a housing is fabricated with dimensions and one or more physical properties similar to those of a cranium, such as described in one or more examples herein.

At 704, a plurality of magnetic field generators are positioned in stationary positions relative to the housing, each is oriented with respect to a corresponding one of multiple directions. The magnetic field generators may each be implemented to generate a magnetic field at a corresponding one of multiple frequencies.

At 706, a gelatinous material, such as described in one or more examples herein, is disposed within the housing.

At 708, a displacement sensor is positioned within the gelatinous material. The first displacement sensor may include a plurality of inductive coils, such as described above with reference to FIG. 6. Each coil of the displacement sensor may be oriented with respect to a corresponding one of multiple directions, and may be implemented to generate an electric signal in response to the plurality of magnetic fields. A magnitude of each of the electric signals may be a function of a position and orientation of the corresponding coil relative to each of the magnetic field generators, such as described above with reference to FIG. 6.

At 710, a signal processor is implemented to separate each of the induced signals into a plurality of component magnitudes, each attributable to a corresponding one of the magnetic fields. An example signal processor is described below with reference to FIGS. 11, 12, and 13.

At 712, a computer-implemented model is constructed to correlate the component magnitudes with a position and orientation of the displacement sensor.

The model may be constructed based on a mathematical model of a magnetic field of a generator, and a mathematical model of magnitudes of signals induced in a displacement sensor coil. Example mathematical models are described below with reference to EQS. 2 and 3.

$$B_I(\vec{r}) = K_I\left(\frac{3(\hat{m}\cdot\hat{r})\hat{r} - \hat{m}}{|\vec{r}|^3}\right) \quad \text{(EQ. 2)}$$

$$V_{Ij}(\vec{r}) = K_{Ij}(\vec{B}_I \cdot \hat{N}_j) \quad \text{(EQ. 3)}$$

EQ. 2 describes a magnetic field [B] at a given location [r] (point dipole model), where [m] represents an orientation of the generator coil.

EQ. 3 relates position [r] with a voltage [V] induced in a coil of displacement sensor. EQ. 3 also accounts for an orientation of the displacement sensor coils, [N], relative to a magnetic field vector $\vec{B}$, and includes for a scaling factor K.

The model may be constructed to implement EQS. 2 and 3 to define or model a position/voltage relationship for between each coil of the displacement sensor, and each generator coil. Where the displacement sensor includes triad-type displacement sensor, such as displacement sensor 506, the model may be constructed to correlate a set of 9 component magnitudes with a position and orientation of displacement sensor 506.

Characteristics of coils of generators 510 may differ from another, and/or characteristics of coils of displacement sensor 506 may differ from one another. To compensate for such differences, a set of one or more parameters may be calibrated with respect to each combination of a generator 510 and a coil of displacement sensor 506. For a triad-type displacement sensor such as displacement sensor 506, 9 sets of the parameters may be calibrated, and the model may be constructed to selectively apply each set to a corresponding combination of a generator coil and a displacement sensor coil. The parameters may include scaling parameters K and b, to be applied to one or more of EQS. 2 and 3.

Figure 8:
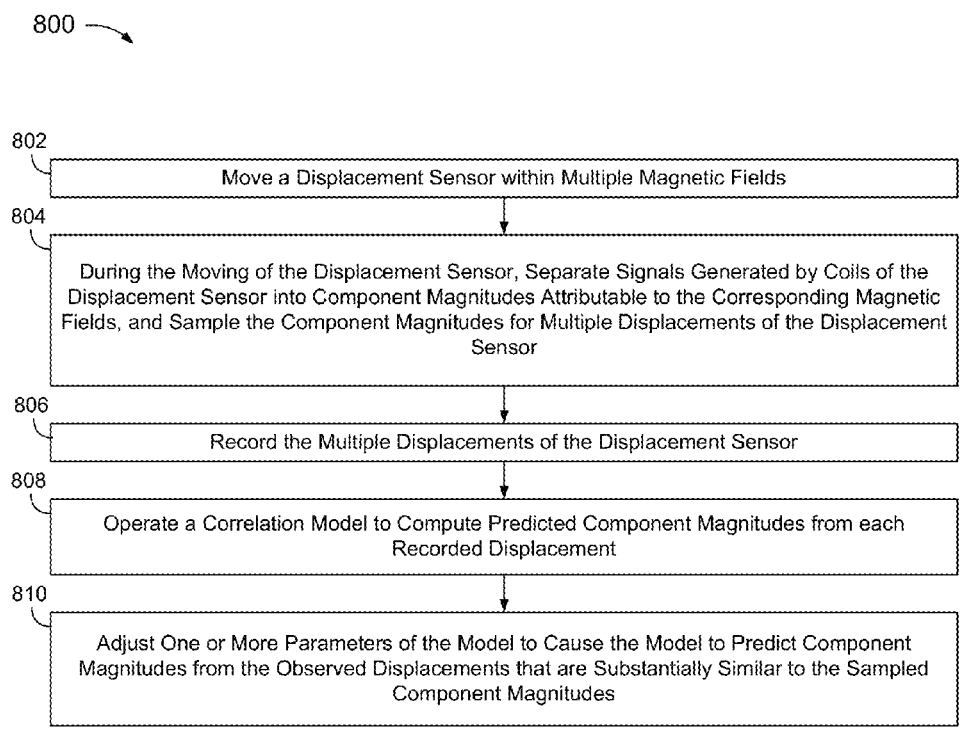
FIG. 8 is a flowchart of a method of calibrating parameters of a model to correlate component magnitudes with a position and orientation of a displacement sensor.

FIG. 8 is a flowchart of a method 800 of calibrating a model to correlate component magnitudes with a position and orientation of a displacement sensor. Method 800 may be implemented to calibrate a model constructed as described above with reference to FIG. 7. Method 800 is described below with reference to displacement sensor 506 and generators 510-1, 510-2, and 510-3, in FIGS. 5 and 6. Method 800 is not, however, limited to the examples of FIG. 5, 6, or 7.

At 802, displacement sensor 506 is moved within magnetic fields of generators 510. Displacement sensor 506 may be moved within a space of approximately 2.5 cm$^3$ within the magnetic fields.

At 804, while displacement sensor 506 is moved within the magnetic fields at 802, signals generated by coils 602, 604, and 606 of displacement sensor 506 are separated into component magnitudes attributable to corresponding generators 510. The component magnitudes may be sampled for each of multiple displacements of the displacement sensor.

At 806, for each of sampling of the component magnitudes, the corresponding displacement of the displacement sensor is recorded or captured, such as with a motion capture system.

At 808, the model may be operated to compute a set of 9 predicted component magnitudes from each recorded displacement. This may be referred to herein as operating the model in reverse.

At 810, one or more parameters of the model may be adjusted to cause the model to predict component magnitudes from the recorded displacements that are substantially similar to the sampled component magnitudes.

The parameters may be adjusted based on one or more statistical best-bit techniques, which may include a regression analysis technique, and which may be implemented to minimize a sum of squared residuals (SSE).

A comparison of the predicted magnitude values and the corresponding sampled component magnitudes may be presented on a display, such as to permit a user to selectively to accept an adjusted parameters as a calibrated parameter. This may be referred to as a supervised learning technique.

Figure 9:
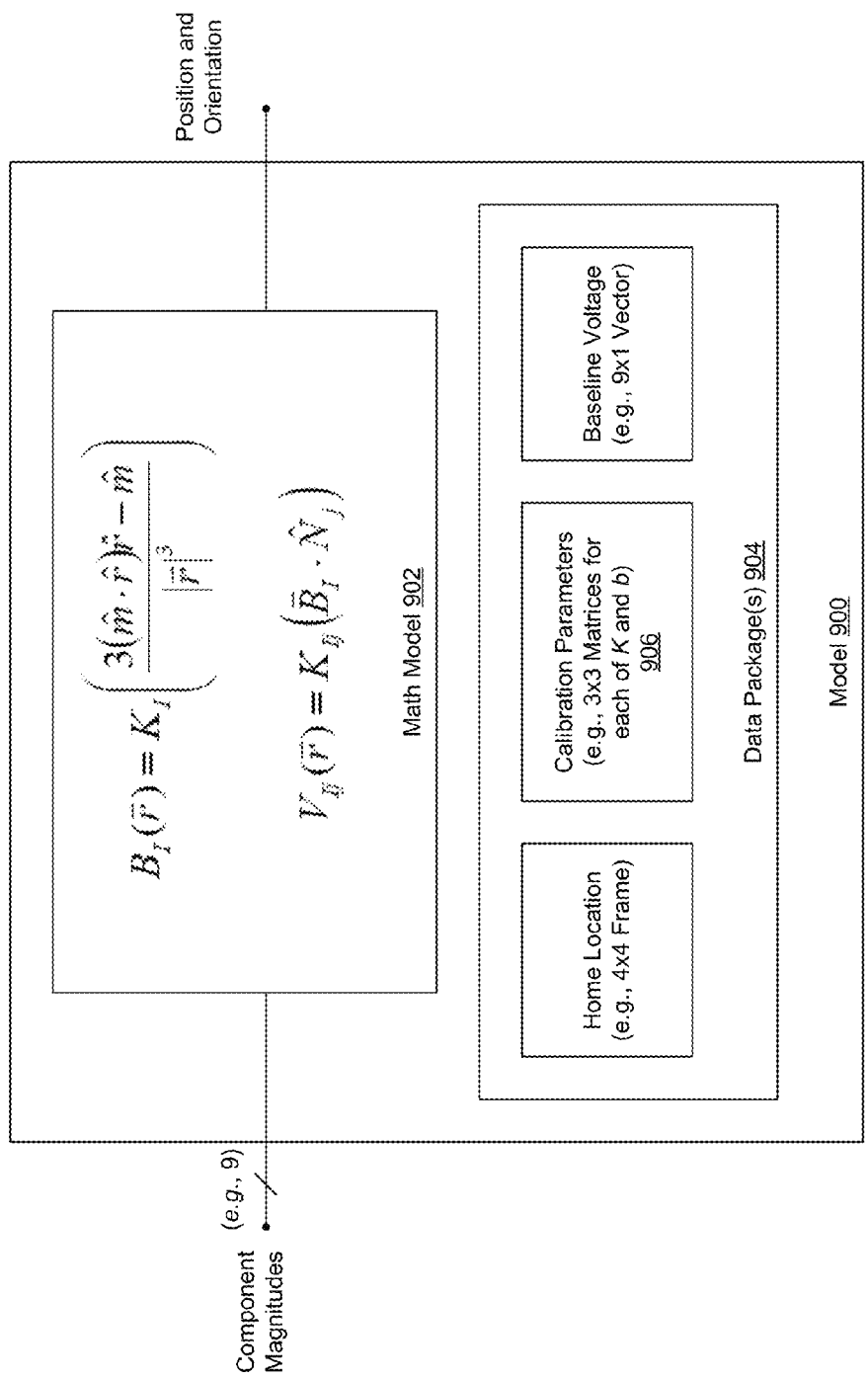
FIG. 9 is a block diagram of a computer-implemented model to correlate component magnitudes with a position and orientation of a displacement sensor.

FIG. 9 is a block diagram of a computer-implemented model 900, including a math model 902 and a data package 904. Math model 902 may be implemented to solve for EQS. 2 and 3, such as described above. Data package 904 may include calibration parameters 906, which may be maintained within corresponding matrices, which may include a 3×3 matrix of values of K, and a 3×3 matrix of values of b.

Where multiple displacement sensors are implemented, model 900 may include multiple data packages 904, each configured for a corresponding displacement sensor, such as described below with reference to FIG. 16.

Figure 10:
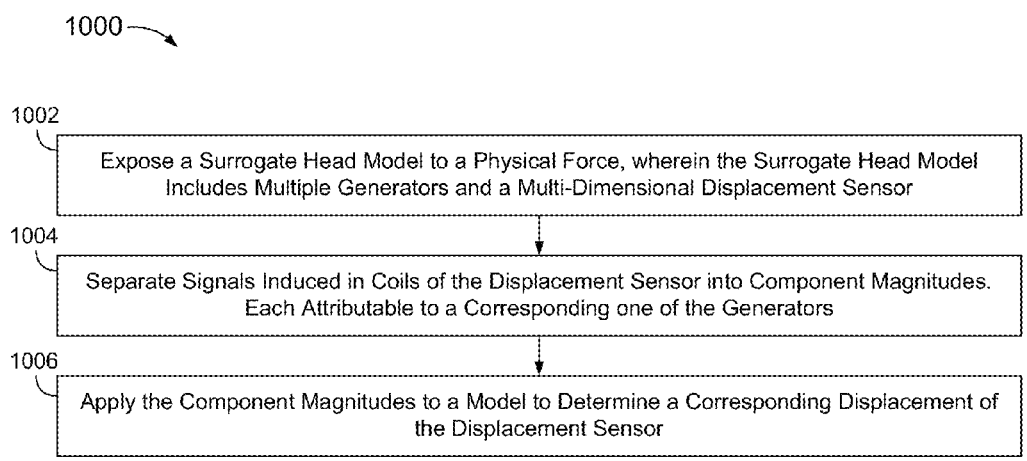
FIG. 10 is a flowchart of a method of measuring displacement of a gelatinous material relative to a housing caused by a physical force directed at the housing.

FIG. 10 is a flowchart of a method 1000 of measuring displacement of a gelatinous material relative to a housing. Method 1000 may be implemented with respect to a surrogate head model to measure brain/skull displacement, such as due to an explosive or ballistic type of event. Method 1000 is described below with reference to generators 510 in FIG. 5 and displacement sensor 506 in FIGS. 5 and 6. Method 1000 is not, however, limited to these examples.

At 1002, a surrogate head model housing is exposed to a physical force. The surrogate head model may include multiple generators 510, a gelatinous material, and a displacement sensor 506.

The force may be sufficient to displace the gelatinous material and displacement sensor 506 relative to the housing, to cause induced currents 610, 612, and 614 to change from steady state or baseline values.

At 1004, each induced current, or a corresponding voltage, is separated into component magnitudes, each attributable to a corresponding one of generators 510. The component magnitudes may be sampled periodically at a rate of, for example, approximately 200 kilo Hertz (kHz).

At 1006, the component magnitudes are applied to a model to determine a corresponding displacement of displacement sensor 506. The displacement may be determined with respect to position and/or orientation, and may be determined relative to a steady state position and/or orientation. The model may be constructed as described above with reference to FIG. 7.

Figure 11:
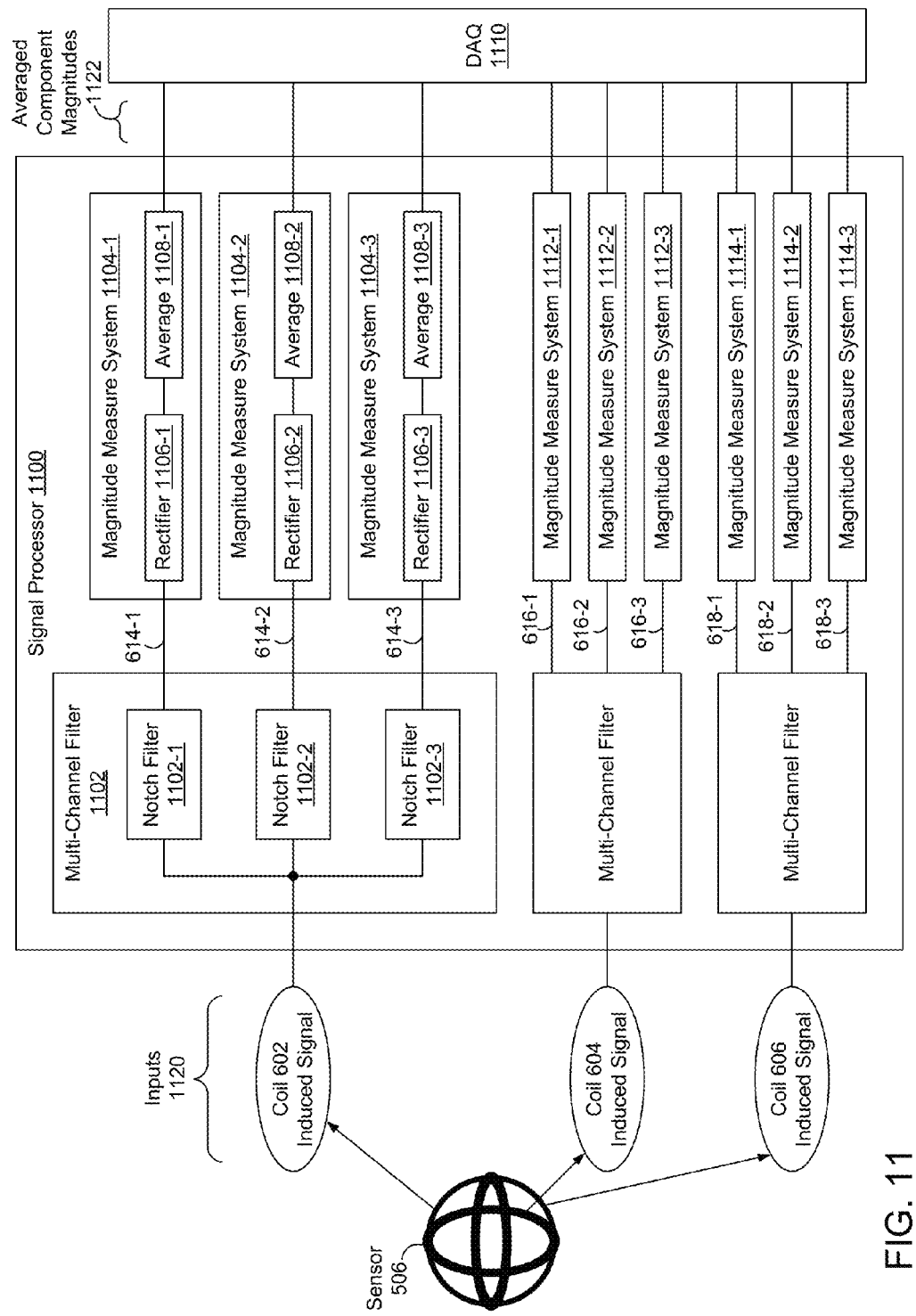
FIG. 11 is a block diagram of a signal processor to separate signals induced in coils of a displacement sensor into component magnitudes attributable to corresponding magnetic fields.

FIG. 11 is a block diagram of a signal processor 1100 to separate signals induced in coils of a displacement sensor into component magnitudes, each attributable to a corresponding magnetic field. For illustrative purposes, signal processor 1100 is described below with reference to displacement sensor 506 in FIGS. 5 and 6. Signal processor 1100 is not, however, limited to the example of displacement sensor 506.

Signal processor 1100 includes 3 signal processing paths, one for each of coils 602, 604, and 606 of sensor 506. The signal processing path for coil 602 is described below. Signal processing paths for coils 604 and 606 may be implemented substantially similar to the signal path of coil 602.

The signal processing path for coil 602 may include a multi-channel filter 1102 to separate component magnitudes from the signal induced in coil 602, based on a distinguishing characteristic of the magnetic fields of generators 510. Where the signals are distinguishable by frequency, multi-channel filter 1102 may be include frequency filters, illustrated here as analog notch filters 1102-1, 1102-2, and 1102-3. Each notch filter may be implemented to pass a frequency or frequency band associated with a corresponding one of generators 510.

Figure 12:
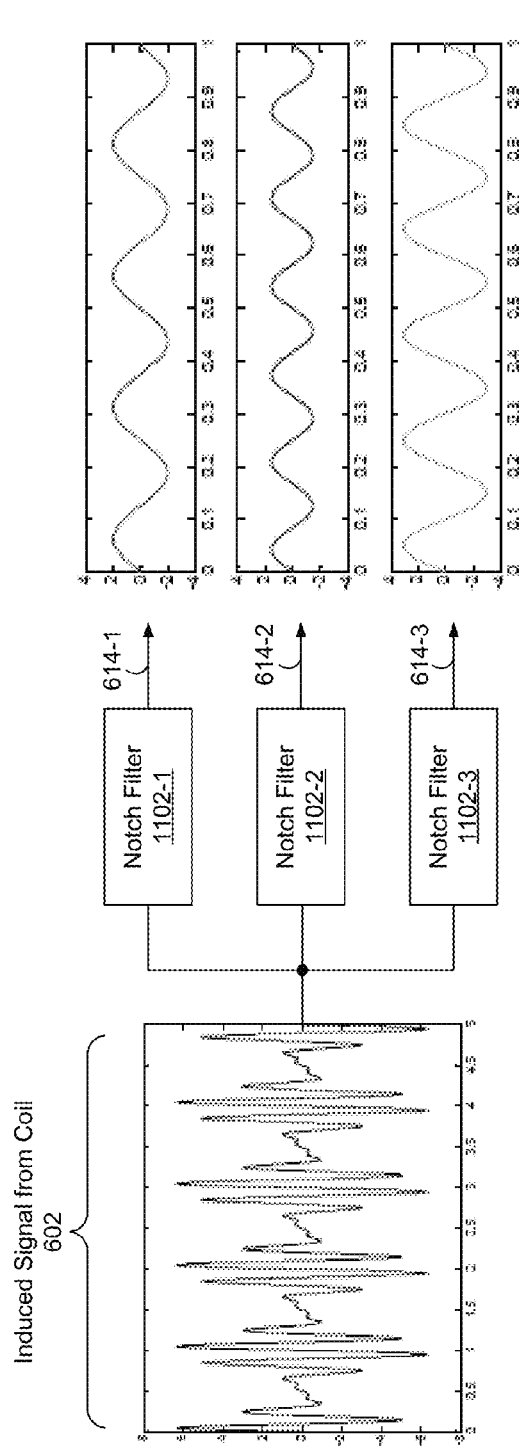
FIG. 12 is an illustration of an induced signal from coil of the displacement sensor of FIG. 5, and corresponding component magnitudes output from notch filters of the signal processor of FIG. 11.

FIG. 12 is an illustration of an induced signal from coil 602 and corresponding component magnitudes 614-1, 614-2, and 614-3 output from respective notch filters 1102-1, 1102-2, and 1102-3.

Returning to FIG. 11, the signal processing path of coil 602 may include magnitude measure systems 1104-1, 1104-2, and 1104-3, each to measure corresponding component magnitude.

Where component magnitudes 614 include alternating current signals, such as illustrated in FIG. 12, each magnitude measure system 1104 may include a rectifier 1106 to convert the alternating signals to direct current signals.

Figure 13:
FIG. 13 is an illustration of the component magnitudes of FIG. 12, rectified to a DC signal by a rectifier of the signal processor of FIG. 11.

FIG. 13 is an illustration of component magnitude 614-1, rectified to a DC signal 1302 by rectifier 1106-1.

Returning to FIG. 11, magnitude measure systems 1104-1, 1104-2, and 1104-3 may each include an averaging system 1108 to average the corresponding component magnitude over time. Averaging systems 1104 may include integration circuits, and may include capacitive circuits.

Averaged component magnitudes 1122 generated by averaging systems 1108 may be provided to a data acquisition system 1110, which may be implemented to sample averaged component magnitudes 1122, and may be implemented to store the samples.

Figure 14:
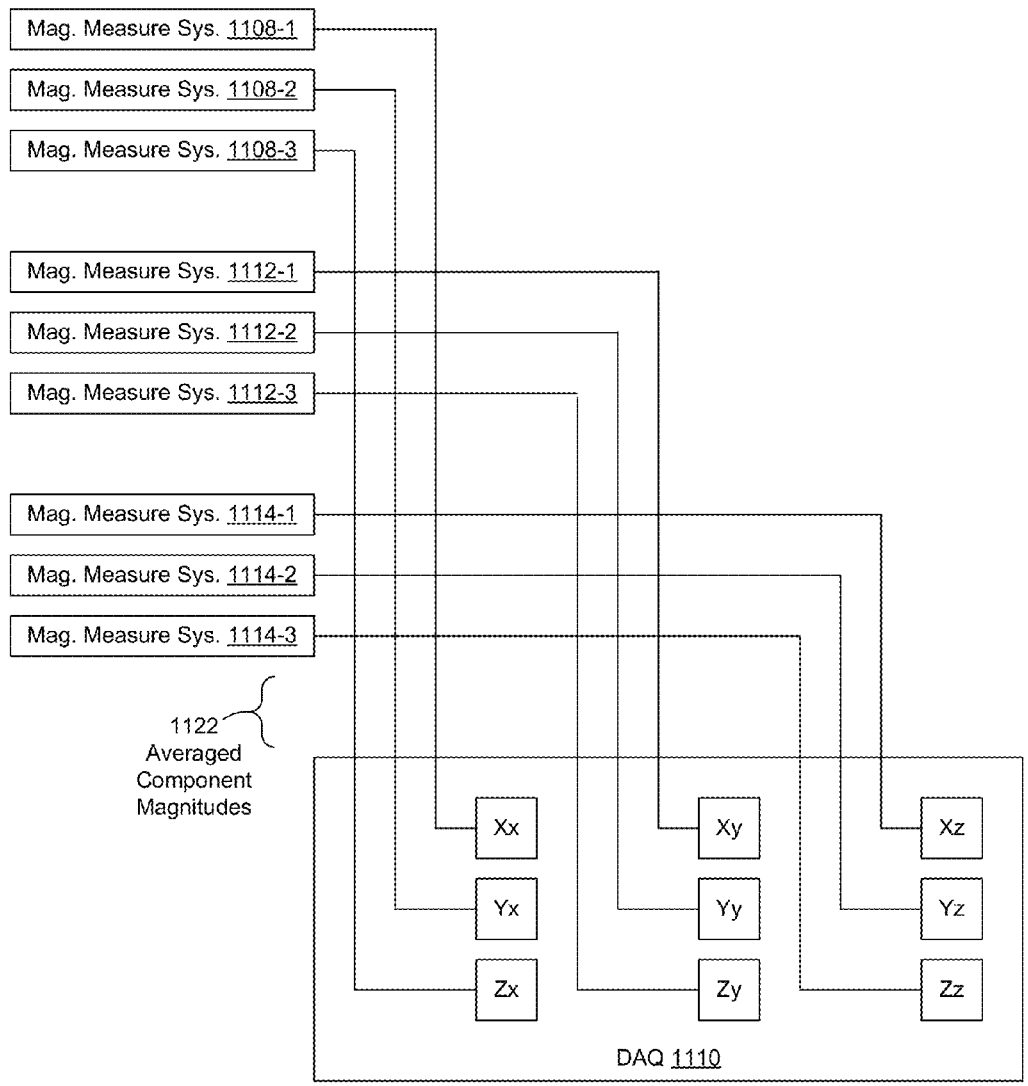
FIG. 14 is a block diagram of data acquisition connections of a data acquisition system illustrated in FIG. 11.

FIG. 14 is a block diagram of data acquisition connections of data acquisition system 1110. Data acquisition system 1110 may store averaged component magnitudes 1122, or samples thereof, as a matrix.

One or more features disclosed herein may be implemented in hardware, software, firmware, and combinations thereof, including discrete and integrated circuit logic, application specific integrated circuit (ASIC) logic, and microcontrollers, and may be implemented as part of a domain-specific integrated circuit package, or a combination of integrated circuit packages. The term software, as used herein, refers to a computer program product including a computer readable medium having computer program logic stored therein to cause a computer system to perform one or more features and/or combinations of features disclosed herein, such as described below with reference to FIG. 15.

Figure 15:
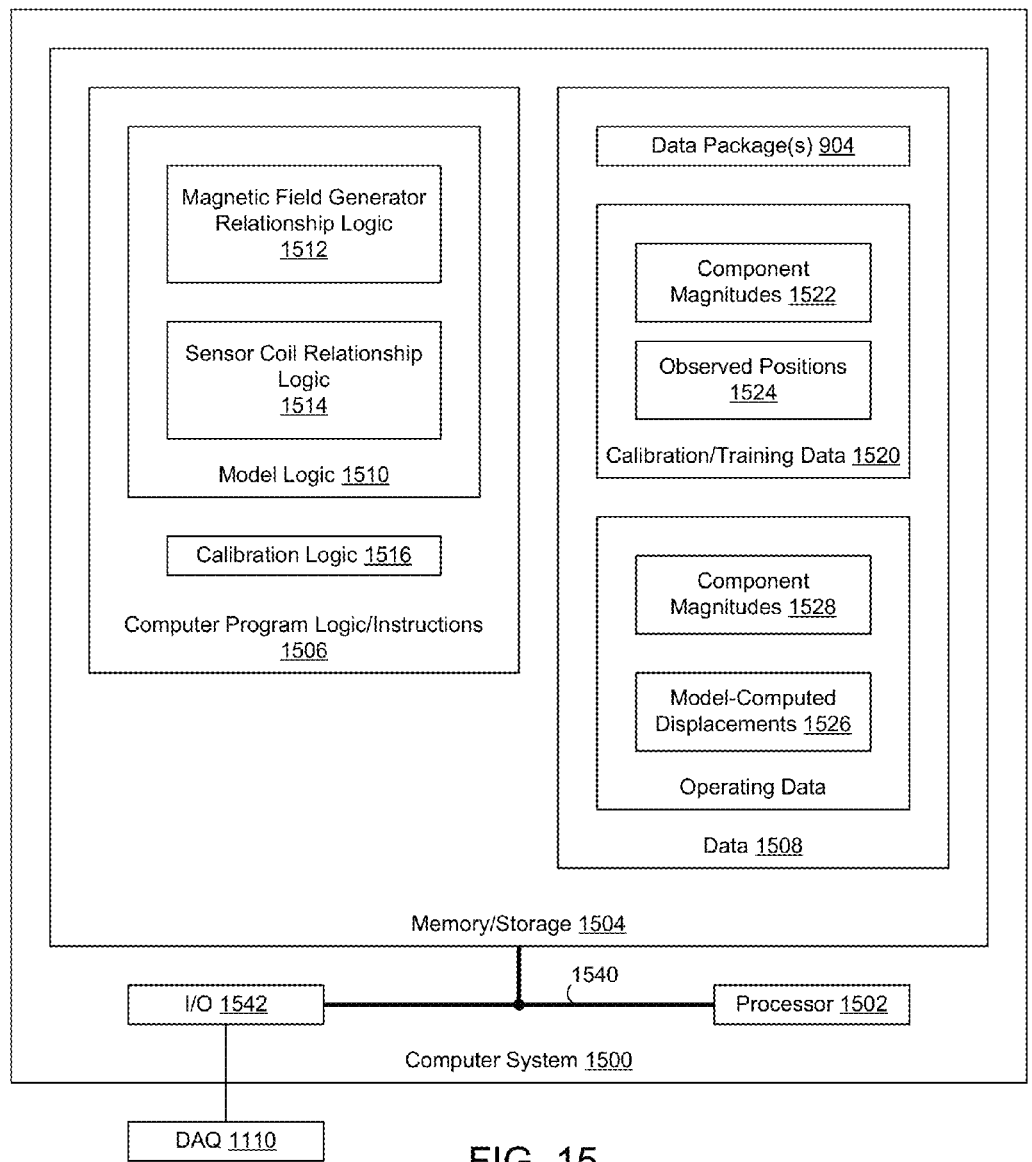
FIG. 15 is a block diagram of a computer system to determine a position and orientation of displacement sensor.

FIG. 15 is a block diagram of a computer system 1500 to determine a position and orientation of displacement sensor.

Computer system 1500 may include one or more computer instruction processing units, illustrated here as a processor 1502, to execute computer program product logic, also known as instructions, code, and software.

Computer system 1500 may include memory, cache, registers, and/or storage, illustrated here as memory 1504, which may include a computer readable medium having computer program logic 1506 stored therein.

Memory 1504 may further include data 1508 to be used by processor 1502 in executing logic 1506, and/or generated by processor 1502 in response to execution of logic 1506.

In the example of FIG. 15, logic 1506 includes model logic 1510 to cause processor 1502 to correlate component magnitudes signals induced in coils of an electromagnetic force (EMF)-based displacement sensor, with a position and orientation of the displacement sensor, such as described in one or more examples herein.

Model logic 1510 may include magnetic field generator relationship logic 1512 to cause processor 1502 mathematically model a relationship between a magnetic field generated by a generator coil and a position and orientation relative to the generator coil, such as described above with respect to EQ. 2.

Model logic 1510 may include sensor coil relationship logic 1514 to cause processor 1502 to mathematically model a relationship between a voltage induced in a coil of the displacement sensor and a position and orientation of the displacement sensor coil, such as described above with respect to EQ. 3.

Data 1508 may include one or more data packages 904, which may include one or more parameters to be used by processor 1502 in execution of model logic 1510, such as described in one or more examples herein.

Data 1508 may include calibration or training data 1520, which may include component magnitudes 1522 of signals generated by the displacement sensor and corresponding recorded displacements, or observed positions 1524, of the displacement sensor, such as described above with reference to method 800.

Logic 1506 may include calibration logic 1516 to cause processor 1502 to calibrate one or more parameters of data package(s) 904 based calibration data 1520, such as described in one or more examples herein.

Logic 1506 may include logic to cause processor 1502 to execute model logic 1510 to compute displacements 1526 of the displacement sensor, based on a combination of component magnitudes 1528 generated by the displacement sensor and data package(s) 904, such as described in one or more examples herein.

Computer system 1500 may include a communications infrastructure 1540 to communicate amongst components of computer system 1500.

Computer system 1500 may include an input/output (I/O) controller 1542 to communicate with one or more other systems. I/O controller 1542 may be implemented to receive component magnitudes 1522 and 1528 from data acquisition system 1110, and observed positions 1524 from a motion capture system. I/O controller 1542 may be implemented to output model computed displacements 1526 to a display and/or other device. I/O controller 1542 may be implemented to output calibration results to a display, such as described above with reference to method 800.

Figure 16:
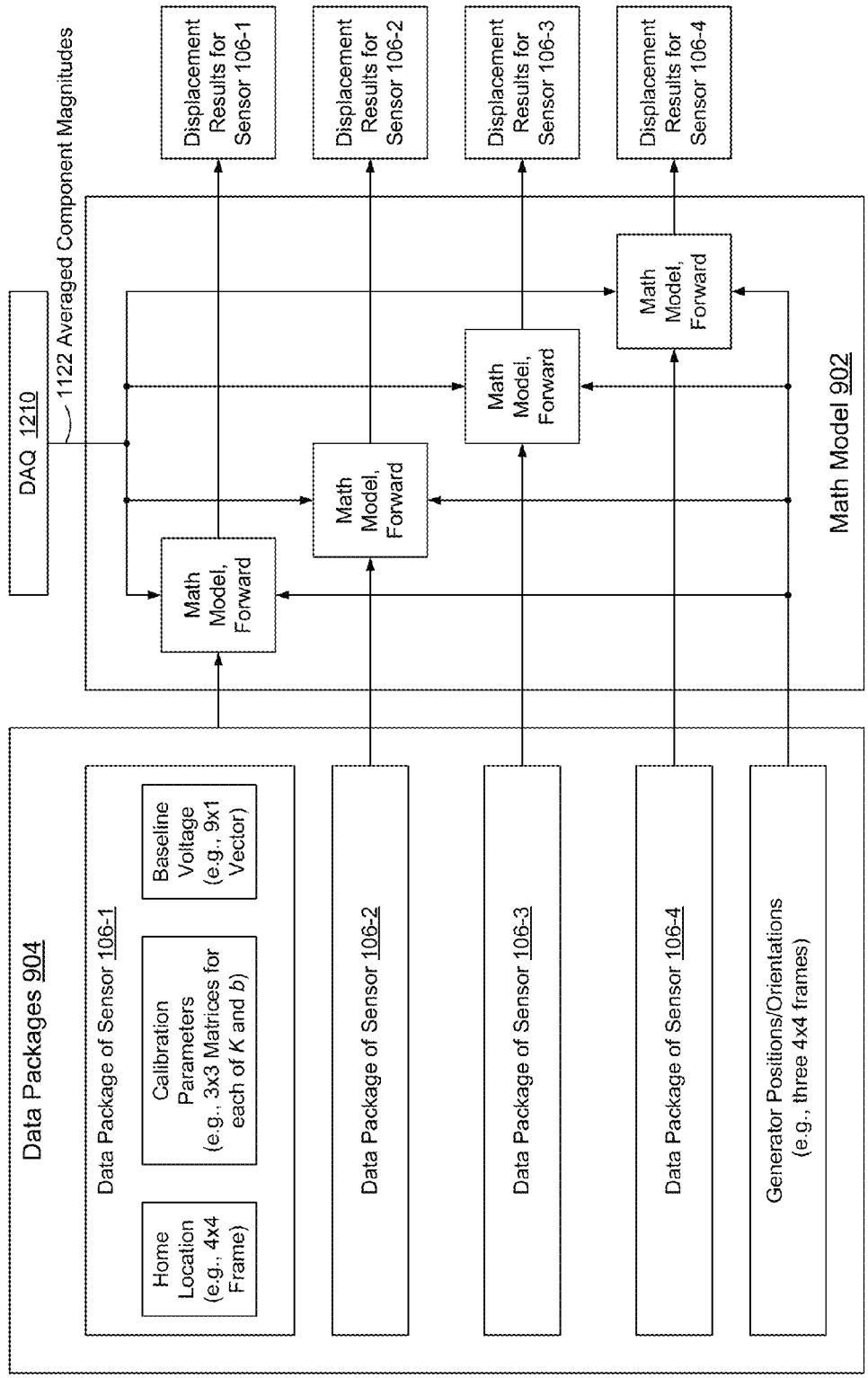
FIG. 16 is a block diagram of math model 902 and data packages 904 of FIG. 9, operated to compute displacement results for multiple displacement sensors.

FIG. 16 is a block diagram of math model 902 of FIG. 9, and multiple data packages 904, each associated with a corresponding one of four displacement sensors, illustrated here as displacement sensors 106-1 through 106-4. In FIG. 16, math model 902 is shown with four instances of a forward-operated math model to illustrate computations of displacements for each of the four displacement sensors based on corresponding component magnitudes and data packages. The four instances of the math model may be executed concurrently, such as in a parallel processing manner, or serially.

Experimental Results

Figure 17:
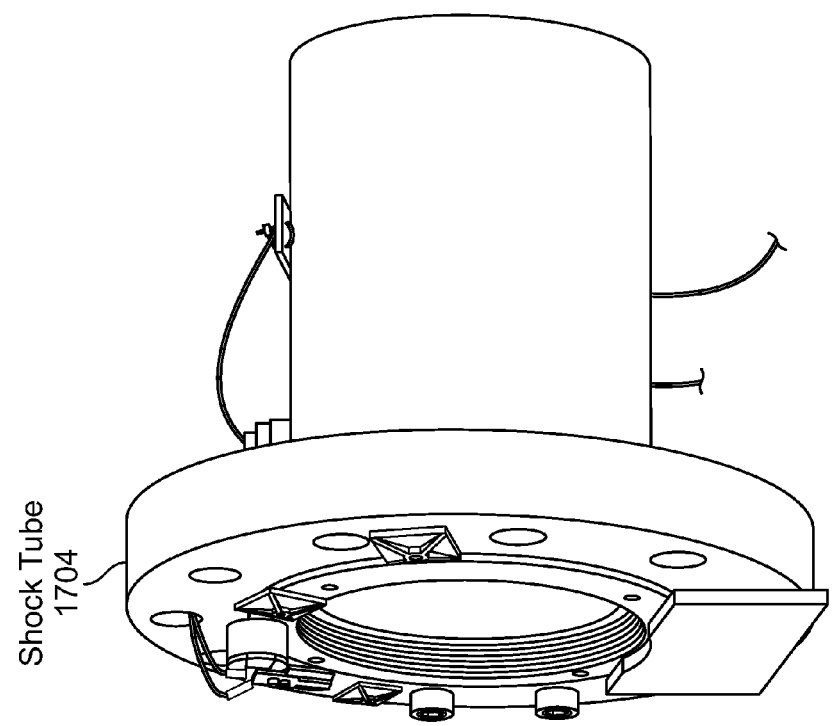
FIG. 17 is an image of a human surrogate head model (HSHM) and a portion of a shock tube to direct a physical force toward the HSHM.
Figure 17:
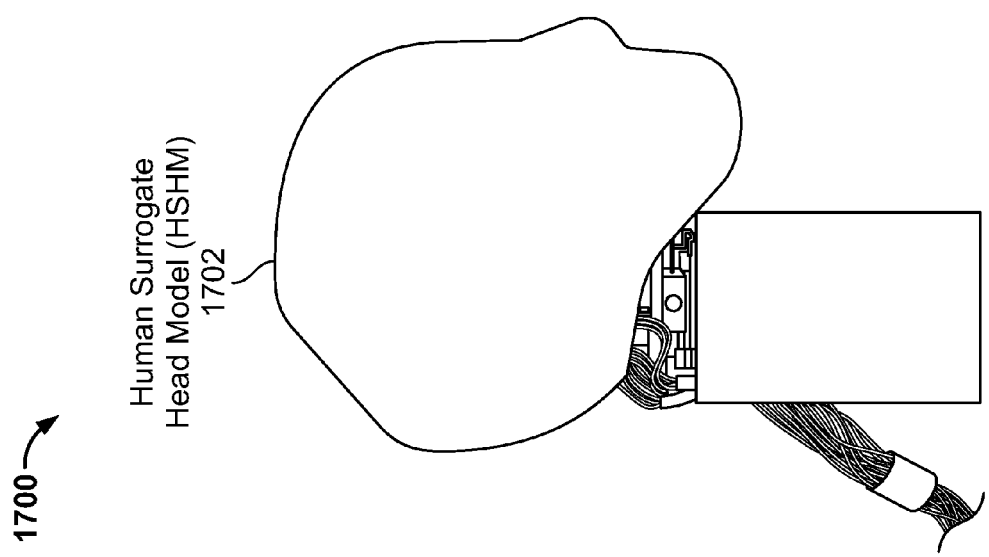

FIG. 17 is an image 1700 of a human surrogate head model (HSHM) 1702, including a headform supported by neck structure, to mimic a response of a human head and neck under a blast load.

The headform includes two skull sections that encase a brain simulant. A lower or bottom portion of the skull is approximately 3 mm thick. An upper, or top portion of the skull is approximately 5 mm thick.

The skull sections and a neck interface are fabricated with a mixture of:
  an Epon 815C epoxy resin, 100 parts by weight, from Miller-Stephenson Chemical Company of Danbury, Conn. ("Miller-Stephenson);
  am Epikure 3234 curing agent, 13 parts by weight, from Miller-Stephenson;
  a KZ 55 coupling agent, 0.5 parts by weight, from Kenrich Petrochemicals, Inc., of Bayonne, N.J.;
  a de-gassing agent, generically known as RP-806, 0.2 parts by weight; and
  #29 milled glass, 40 parts by weight, from Fibre Glast Developments Corporation, of Brookville, Ohio.

The headform includes a facial structure surrounding the lower portion of the skull. The facial structure includes four pieces of relatively hard, lightweight syntactic foam. The facial structure includes two eye socket cavities filled with a relatively soft biosimulant material to approximate eyes.

The facial structure is fabricated with a mixture of:
  an Epon 862 epoxy resin, 26.04 parts by weight, from Miller-Stephenson;
  an Epikure 3274 curing agent, 8.19 parts by weight, from Miller-Stephenson;
  the Epikure 3234 curing agent, 1 part by weight, from Miller-Stephenson; and
  a Syntac V32 syntactic foam, 10.6 parts by weight, from Trelleborg Offshore Boston, Inc., of Mansfield, Mass. (formerly, Emerson and Cuming Composite Materials, Inc.).

The brain simulant is the Sylgard® 527, discussed above, including equal amounts of Sylgard® 527, Part A and Part B. The brain simulant is cast in place inside the skull around pressure and displacement sensors.

The skull includes a cavity inside a chin portion to receive an inertial sensor to measure six degrees of freedom of the skull.

The headform includes two pieces of foam form geometry surrounding a back or rear portion of the lower skull portion.

The headform further includes a silicone sheathe skin simulant stretched over the skull and instrumentation. The skin simulant is fabricated with a mixture of an XP-656 silicon, 99.3 parts by weight, from Silicones, Inc., of High Point, N.C., and a pigment, 0.7 parts by weight, from Silicones, Inc. The silicone sheathe skin simulant is nominally ³⁄₁₆ inches thick, and serves to slightly dampen impact, similar to impact dampening provided by human dermis.

The upper portion of the skull is in direct contact with the skin simulant, and includes space for EMF generator coils under the skin simulant.

The neck includes three adjustable tension bands to help control kinematics of the neck. The tension bands include an anterior tension band, loaded with 6 pounds of tensile force applied linearly to a loop at an end of the band, and two posterior bands, loaded with 3 pounds of tension.

One-inch quadrant targets were bonded to the surface of the skin simulant for high-speed video analysis and calibration.

HSHM 1702 includes include four, 6-DOF displacement sensors within the brain simulant, as described in examples above.

HSHM 1702 further includes three intracranial pressure sensors within the brain simulant, five surface-mounted pressure sensors, and one 6-DOF inertial sensor to measure gross head kinematics. The gross head kinematics may be used to characterize a response of HSHM 1702 to blast loading. FIG. 18 is a table 1800 of features of the pressure sensors and components of the inertial sensor.

Sensor positions are described below with reference to a coordinate system having an origin at a posterior surface of the skull, at the geometric center of the rear EMF generator coil. The coordinate system includes an X-axis that points toward the anterior portion of the skull, a Y-axis that points from the left side of the skull to the right side of the skull, and a Z-axis that points upwardly.

Receiver coils of the four 6-DOF displacement sensors, denoted here as A, B, C, and D, are positioned at the following X, Y, and Z coordinates, measured in inches:
 coil A: [5.750, 0.000, 0.000],
 coil B: [5.000, 0.000, 0.000];
 coil C: [2.750, 0.000, 0.000]; and
 coil D: [2.000, 0.000, 0.000].

The three intracranial pressure sensors, denoted here as ICP_ANT, ICP_POS1, and ICP_POS2, are positioned at the following X, Y, and Z coordinates, measured in inches:
 ICP_ANT: [5.375, 0.000, −0.500];
 ICP_POS1: [2.375, 0.000, −0.500]; and
 ICP_POS2: [2.375, −0.250, −0.500].

Intracranial pressure sensor ICP_POS2 faces backwards in the head.

The five surface-mounted pressure sensors are positioned on a surface of the skin simulant, each at a corresponding one of:
 center of the forehead;
 below the right eye;
 on the chin;
 a side of the headform; and
 rear of the headform.

The 6-DOF inertial sensor is positioned within the chin cavity.

HSHM 1702 was calibrated and subjected to shock tube blasts, with the HSHM positioned both 12 and 6 inches from an exit plane of the shock tube. A driver section of the shock tube was pressurized with approximately 100 psi of helium at burst, which generated a shock wave traveling the length of the tube until impacting the HSHM at the tube opening. When the pressure wave impacted the HSHM, the HSHM began to rotate backward into a neck extension (i.e., biofidelic neck 216 in FIGS. 2, 3A, and 3B, and 4).

Displacement results from anterior and posterior displacement sensors indicate combined translation and rotation of the brain simulant relative to the skull. Displacement results further indicate that magnitudes of the translations and rotations increased with driver pressure, as expected.

Displacement results further indicate that in the first 25 milliseconds of the blast events, as the shock front propagates through the HSHM, the displacement sensors are forced to move backward with respect to the skull. Simultaneously, inertial forces act to keep the brain simulant stationary while the head and neck begin to rotate into extension. When the displacement sensors are positions below a center of rotation of the brain, displacement results indicate a translation downward with respect to the skull in the anterior region and upward relative motion in the posterior region.

As the neck begins to decelerate and as the shock wave dissipates approximately 50 ms after the onset of the blast event, a reverse phenomenon occurs, in which the anterior displacement sensor moves in the anterior-superior direction, and the posterior displacement sensor moves in the anterior-inferior direction. In both locations, the displacement sensors overshoot their initial rest or baseline positions before settling begins.

After approximately 50 ms subsequent to the onset of the blast event, the displacement sensors settle back to their initial positions as the brain simulant material restores itself to its rest shape over the next 150 ms.

A characteristic pressure-time plot of intracranial pressure was recorded by the anterior pressure sensor during an exposure to load case 2. The pressure signature showed an initial dominant peak followed by oscillation until the pressure reaches nearly zero approximately 15 ms after impact. The peak pressures in the anterior region of the brain were found to be greater than those measured in the posterior region.

Local brain displacements with respect to the skull in the anterior portion of the head were typically slightly greater than the posterior displacements for a given loading condition. Directional displacement response varied with displacement sensor location. For a given location, the shape of the displacement pattern remained similar, while the magnitude of displacement increased with increased loading conditions. Measured brain displacement, primarily due to head kinematics, often continued for more than 50 ms after the HSHM was impacted by the incident pressure wave.

Methods and systems are disclosed herein with the aid of functional building blocks illustrating the functions, features, and relationships thereof. At least some of the boundaries of these functional building blocks have been arbitrarily defined herein for the convenience of the description. Alternate boundaries may be defined so long as the specified functions and relationships thereof are appropriately performed.

One skilled in the art will recognize that these functional building blocks can be implemented by discrete components, application specific integrated circuits, processors executing appropriate software, and combinations thereof.

While various embodiments are disclosed herein, it should be understood that they have been presented by way of example only, and not limitation. It will be apparent to persons skilled in the relevant art that various changes in form and detail may be made therein without departing from the spirit and scope of the methods and systems disclosed herein. Thus, the breadth and scope of the claims should not be limited by any of the example embodiments disclosed herein.

What is claimed is:

1. A system, comprising:
 a housing having dimensions and one or more physical properties similar to that of a cranium;
 a gelatinous material disposed within the housing, having a viscosity similar to that of brain tissue;

a plurality of magnetic field generators, each in a stationary position relative to the housing, each to generate a magnetic field at a corresponding one of multiple frequencies, and oriented with respect to a corresponding one of multiple directions;

a first displacement sensor disposed within the gelatinous material and configured to be neutrally buoyant in the gelatinous material, wherein the first displacement sensor includes a plurality of inductive coils, each oriented with respect to a corresponding one of multiple directions, each coil to generate a signal indicative of an electromagnetic force (EMF) induced in the coil by the plurality of magnetic fields, wherein a magnitude of the signal is a function of a position and orientation of the coil relative to positions and orientations of each of the plurality of magnetic field generators;

a signal processor to separate each of the signals into a plurality of component magnitudes, each attributable to a corresponding one of the magnetic fields; and a configurable computer-implemented model to correlate between the component magnitudes of the plurality of coils and a corresponding position and orientation of the first displacement sensor.

2. The system of claim 1, wherein the first displacement sensor includes: three substantially planar inductive coils oriented orthogonally with respect to one another and co-aligned about a point.

3. The system of claim 2, wherein the first displacement sensor is implemented to generate the signals with a level of granularity that corresponds to a positional displacement of less than approximately 0.5 millimeters and an angular displacement of less than approximately 1 degree, and with a response time of less than approximately 50 microseconds.

4. The system of claim 3, wherein the wherein the coils of the first displacement sensor have a diameter within a range of approximately 3 to 5 millimeters (mm), and cross-sectional area equivalent to approximately 50 windings of a wire having a diameter of approximately 0.1 mm.

5. The system of claim 1, wherein the model includes:
a first model of a relationship between a magnetic field of the magnetic field generator and a position and orientation relative to the magnetic field generator;
a second model of a relationship between a component magnitude of a signal induced in the displacement sensor coil, and a position and orientation of the displacement sensor coil relative to a corresponding magnetic field vector; and
a set of one or more configurable parameters for each combination of a magnetic field generator and a displacement sensor coil;
wherein the computer-implemented model is implemented to apply each set of parameters to the first and second models to correlate a position and orientation of each displacement sensor coil with respect to each of the magnetic field generators; and
wherein the computer-implemented model is further implemented to correlate between the position and orientation of the first displacement sensor, and the position and orientation of each displacement sensor coil relative to each of the magnetic field generators.

6. The system of claim 5, wherein the sets of one or more parameters are calibrated to cause the model to compute predicted component magnitudes, based on observed positions of the first displacement sensor, substantially equal to component magnitudes of signals generated by the first displacement sensor at the corresponding observed positions, based on a best-fit analysis.

7. The system of claim 1, further including second, third, and fourth displacement sensors substantially similar to the first displacement sensor, and first and second pressure sensors, wherein:
the first, second, third, and fourth displacement sensors are aligned substantially longitudinally between a posterior region of the housing and an anterior region of the housing;
the first and second displacement sensors are disposed within the posterior region within approximately 5 millimeters of one another;
the third and fourth displacement sensors are disposed within the anterior region within approximately 5 millimeters of one another;
the first pressure sensor disposed within the gelatinous material proximate to the first and second displacement sensors;
the second pressure sensor disposed within the gelatinous material proximate to the third and fourth displacement sensors; and
the computer-implemented model is implemented to determine a measure of strain between the first and second displacement sensors and between the third and fourth displacement sensors.

8. A method of implementing a surrogate head model to measure displacement of a brain stimulant in response to a physical force, comprising:
fabricating a housing with dimensions and one or more physical properties similar to those of a cranium;
disposing a gelatinous material within the housing, wherein the gelatinous material has a firmness similar to that of brain tissue;
positioning each of a plurality of magnetic field generators in a stationary position relative to the housing, and orienting each of the magnetic field generators with respect to a corresponding one of multiple directions, wherein each of the magnetic field generators is implemented to generate a magnetic field at a corresponding one of multiple frequencies;
disposing a first displacement sensor within the gelatinous material such that the first displacement sensor is neutrally buoyant in the gelatinous material, the first displacement sensor including a plurality of inductive coils, each oriented with respect to a corresponding one of multiple directions, each coil to generate a signal indicative of an electromagnetic force (EMF) induced in the coil by the plurality of magnetic fields, wherein a magnitude of the signal is a function of a position and orientation of the coil relative to positions and orientations of each of the plurality of magnetic field generators;
implementing a signal processor to measure and separate each of the signals into a plurality of component magnitudes, each attributable to a corresponding one of the magnetic fields in response to application of the physical force; and
implementing a configurable computer-implemented model to correlate between the component magnitudes of the plurality of coils and a corresponding position and orientation of the first displacement sensor.

9. The method of claim 8, further including: fabricating the first displacement sensor to include three substantially planar inductive coils oriented orthogonally with respect to one another and co-aligned about a point.

10. The method of claim 9, wherein the fabricating of the first displacement sensor includes: fabricating the first displacement sensor to generate the signals with a level of granularity that corresponds to a positional displacement of less than approximately 0.5 millimeters and an angular displacement of less than approximately 1 degree, and with a response time of less than approximately 50 microseconds.

11. The method of claim 10, wherein the fabricating of the first displacement sensor further includes: fabricating the first coils of the first displacement sensor to the coils to have a diameter within a range of approximately 3 to 5 millimeters (mm), and cross-sectional area equivalent to approximately 50 windings of a wire having a diameter of approximately 0.1 mm.

12. The method of claim 8, wherein the implementing of the computer-implemented model includes:
implementing a first model of a relationship between a magnetic field of the magnetic field generator and a position and orientation relative to the magnetic field generator;
implementing a second model of a relationship between a component magnitude of a signal induced in the displacement sensor coil, and a position and orientation of the displacement sensor coil relative to a corresponding magnetic field vector; and
initializing a set of one or more configurable parameters for each combination of a magnetic field generator and a displacement sensor coil;
implementing the computer-implemented model to apply each set of parameters to the first and second models to correlate a position and orientation of each displacement sensor coil with respect to each of the magnetic field generators; and
implementing the computer-implemented model to correlate between the position and orientation of the first displacement sensor, and the position and orientation of each displacement sensor coil relative to each of the magnetic field generators.

13. The method of claim 12, further including: calibrating the parameters to cause the model to compute predicted component magnitudes, based on observed positions of the first displacement sensor, substantially equal to component magnitudes of signals generated by the first displacement sensor at the corresponding observed positions, based on a best-fit analysis.

14. The method of claim 8, further including: disposing second, third, and fourth displacement sensors, substantially similar to the first displacement sensor, within the gelatinous material: aligning the first, second, third and fourth displacement sensors substantially longitudinally between a posterior region of the housing and an anterior region of the housing;
positioning the first and second displacement sensors within the posterior region within approximately 5 millimeters of one another; positioning the third and fourth displacement sensors within the anterior region within approximately 5 millimeters of one another; disposing a first pressure sensor disposed within the gelatinous material proximate to the first and second displacement sensors; disposing a second pressure sensor disposed within the gelatinous material proximate to the third and fourth displacement sensors; and implementing the computer-implemented model to determine a measure of strain between the first and second displacement sensors and between the third and fourth displacement sensors.

15. The method of claim 8, further including: generating a magnetic field with each of the plurality of magnetic field generators subjecting the surrogate head model to a physical force; separating signals generated by the first displacement sensor subsequent to the physical force into a plurality of component magnitudes, each attributable to a corresponding one of the magnetic fields; and sampling the plurality of component magnitudes at a rate of at least approximately 200 kiloHertz; and applying each set of the samples of the plurality of the component magnitudes to the calibrated computer-implemented model to determine a corresponding position and orientation of the first displacement sensor.

16. A computer program product comprising a non-transitory computer readable medium having computer program logic stored thereon, wherein the computer program logic includes:
model logic to cause a computer system to correlate component magnitudes of each of at least three signals induced in corresponding coils of an electromagnetic force (EMF) based displacement sensor configured to be neutrally buoyant in a gelatinous material, with a position and orientation of the displacement sensor;
wherein each of the at least three signals are induced by a combination of at least three magnetic fields, and the component magnitudes of each of the induced signals are attributable to a corresponding one of the magnetic fields.

17. The computer program product of claim 16, wherein the model logic includes:
logic to cause the computer system to correlate the component magnitudes with the position and orientation based on a combination of, a first model of a relationship between a magnetic field of the magnetic field generator and a position and orientation relative to the magnetic field generator, a second model of a relationship between a component magnitude of a signal induced in the displacement sensor coil, and a position and orientation of the displacement sensor coil relative to a corresponding magnetic field vector, and a set of one or more configurable parameters for each combination of a magnetic field generator and a displacement sensor coil;
logic to cause the computer system to apply each set of parameters to the first and second models to correlate a position and orientation of each displacement sensor coil with respect to each of the magnetic field generators; and
logic to cause the computer system to correlate between the position and orientation of the first displacement sensor, and the position and orientation of each displacement sensor coil relative to each of the magnetic field generators.

18. The computer program product of claim 17, wherein the computer program logic further includes: calibration logic to cause the computer system to calibrate the sets of one or more parameters to cause the model logic to compute predicted component magnitudes, based on observed positions of the first displacement sensor, substantially equal to component magnitudes of signals generated by the first displacement sensor at the corresponding observed positions, based on a best-fit analysis.

19. The computer program product of claim 16, wherein the computer program logic further includes: logic to cause the computer system to execute the model logic with the calibrated sets of one or more parameters to determine a position and orientation of the displacement sensor from component magnitudes of each of at least three signals induced in corresponding coils of the displacement sensor.

20. The computer program product of claim 19, wherein the model logic includes: logic to cause the computer system to determine a measure of strain from component magnitudes of signals induced in multiple displacement sensors positioned proximate to one another.

\* \* \* \* \*